US007626257B2

(12) United States Patent
Knorr

(10) Patent No.: US 7,626,257 B2
(45) Date of Patent: Dec. 1, 2009

(54) SEMICONDUCTOR DEVICES AND METHODS OF MANUFACTURE THEREOF

(75) Inventor: Andreas Knorr, Austin, TX (US)

(73) Assignee: Infineon Technologies AG, Munich (DE)

( * ) Notice: Subject to any disclaimer, the term of this patent is extended or adjusted under 35 U.S.C. 154(b) by 70 days.

(21) Appl. No.: 11/334,704

(22) Filed: Jan. 18, 2006

(65) Prior Publication Data
US 2007/0166997 A1    Jul. 19, 2007

(51) Int. Cl.
    *H01L 23/538* (2006.01)
(52) U.S. Cl. .............. 257/698; 257/777; 257/E21.677; 257/E23.011; 257/E21.597; 438/107; 438/109; 438/244; 438/387; 438/455; 438/459; 438/667
(58) Field of Classification Search .......... 438/622, 438/618, 386, 387, 391, 243, 107, 109, 244, 438/455, 459, 667, FOR. 220; 257/777, 257/698, E21.677, E23.011, E21.597
    See application file for complete search history.

(56) References Cited

U.S. PATENT DOCUMENTS

| | | | | |
|---|---|---|---|---|
| 3,323,198 | A * | 6/1967 | Shortes .................. | 438/603 |
| 4,612,083 | A * | 9/1986 | Yasumoto et al. ............ | 438/59 |
| 4,902,637 | A * | 2/1990 | Kondou et al. ............. | 438/152 |
| 4,939,568 | A * | 7/1990 | Kato et al. .................. | 257/686 |
| 5,654,220 | A * | 8/1997 | Leedy ......................... | 438/25 |
| 5,998,292 | A * | 12/1999 | Black et al. ................. | 438/618 |
| 6,387,772 | B1 * | 5/2002 | Chittipeddi et al. ......... | 438/386 |
| 6,627,531 | B2 * | 9/2003 | Enquist ....................... | 438/622 |
| 6,762,076 | B2 * | 7/2004 | Kim et al. .................... | 438/107 |
| 6,830,970 | B2 * | 12/2004 | Gardes ......................... | 438/238 |
| 6,864,585 | B2 * | 3/2005 | Enquist ....................... | 257/777 |
| 6,984,571 | B1 * | 1/2006 | Enquist ....................... | 438/459 |
| 7,126,212 | B2 * | 10/2006 | Enquist et al. .............. | 257/684 |
| 2001/0005059 | A1 * | 6/2001 | Koyanagi et al. ............ | 257/778 |
| 2002/0025604 | A1 * | 2/2002 | Tiwari ......................... | 438/118 |
| 2002/0109236 | A1 | 8/2002 | Kim et al. | |
| 2003/0157748 | A1 * | 8/2003 | Kim et al. .................... | 438/107 |
| 2004/0108587 | A1 * | 6/2004 | Chudzik et al. ............. | 257/700 |
| 2004/0248374 | A1 * | 12/2004 | Belyansky et al. .......... | 438/428 |
| 2004/0250221 | A1 * | 12/2004 | Bard et al. ..................... | 716/1 |
| 2005/0059217 | A1 | 3/2005 | Morrow et al. | |
| 2005/0121768 | A1 | 6/2005 | Edelstein et al. | |
| 2005/0127473 | A1 * | 6/2005 | Sakagami .................... | 257/510 |
| 2006/0131691 | A1 * | 6/2006 | Roozeboom et al. ........ | 257/534 |
| 2006/0202249 | A1 * | 9/2006 | Cheng et al. ................. | 257/301 |

FOREIGN PATENT DOCUMENTS

WO    WO 2004/114397 A1    12/2004

OTHER PUBLICATIONS

Lammers, D., "Sematech Targets Infrastructure for 3-D Chips," EETimes Online, Jan. 16, 2006, 3 pages, http://www.eetimes.com/showArticle.jhtml?articleID=177100129&printable=true, CMP Media, LLC., Washington, DC.

* cited by examiner

*Primary Examiner*—George Fourson
(74) *Attorney, Agent, or Firm*—Slater & Matsil, L.L.P.

(57) ABSTRACT

Vertically stacked integrated circuits and methods of fabrication thereof are disclosed. Deep vias that provide vertical electrical connection for vertically stacked integrated circuits are formed early in the manufacturing process, before integrated circuits are bonded together to form a three dimensional integrated circuit (3D-IC).

45 Claims, 13 Drawing Sheets

SEMICONDUCTOR DEVICES AND METHODS OF MANUFACTURE THEREOF

TECHNICAL FIELD

The present invention relates generally to the fabrication of semiconductor devices, and more particularly to the fabrication of vertically stacked integrated circuits.

BACKGROUND

Semiconductor devices are used in a variety of electronic applications, such as computers, cellular phones, personal computing devices, and many other applications. Home, industrial, and automotive devices that in the past comprised only mechanical components now have electronic parts that require semiconductor devices, for example.

Semiconductor devices are manufactured by depositing many different types of material layers over a semiconductor workpiece or wafer, and patterning the various material layers using lithography. The material layers typically comprise thin films of conductive, semiconductive, and insulating materials that are patterned and etched to form integrated circuits (ICs). There may be a plurality of transistors, memory devices, switches, conductive lines, diodes, capacitors, logic circuits, and other electronic components formed on a single die or chip, for example.

After an integrated circuit is manufactured, individual die are singulated from the wafer, and typically, the die is packaged. For many years, the most common way of packaging a die was horizontal placement within individual plastic or ceramic packages. Alternatively, several die may be packaged horizontally in a single package, forming a multi-chip module. Electrical connections are made to terminals or bond pads of the die, e.g., using very small strands of wire, which is routed to pins of the package.

A demand for smaller ICs with higher performance has led to the development of system-on-a-chip devices, where portions of the chip are dedicated to memory and other portions are dedicated to logic or other types of circuitry. However, it can be difficult to manufacture an IC with multiple types of circuitry, due to integration problems of the different circuit fabrication technologies.

One trend in the semiconductor industry is the movement towards three dimensional integrated circuits (3D-ICs), for example, where two or more chips or wafers are stacked and vertically integrated. Parts of a circuit are fabricated on different wafers, and the wafers or die are bonded together with a glue layer such as copper or a polymer based adhesive. Different types of circuits, e.g., memory and logic, as examples, may be manufactured separately and then vertically attached, which may be less expensive and easier to manufacture than combining the two circuit technologies on a single wafer as in system-on-a-chip devices. 3D-ICs are predicted to be used in the future for low power, high speed applications, because the paths of conduction may be shortened by the vertical electrical connections between the circuits, resulting in low power consumption and increased speed.

However, 3D-ICs introduce some design and fabrication challenges. For example, the etch processes required to produce the vertical connections between vertically stacked ICs may be difficult, due to the many different types of material layers and the thickness of the material layers that must be etched.

Thus, improved methods of fabricating 3D-ICs and structures thereof are needed in the art.

SUMMARY OF THE INVENTION

These and other problems are generally solved or circumvented, and technical advantages are generally achieved, by preferred embodiments of the present invention, which provide novel methods of connecting two or more ICs together to form 3D-ICs and structures thereof.

In accordance with a preferred embodiment of the present invention, a method of fabricating a semiconductor device includes fabricating a first integrated circuit, fabricating a second integrated circuit, and vertically coupling the second integrated circuit to the first integrated circuit. Fabricating the first integrated circuit includes providing a first workpiece, forming at least one first active area within the first workpiece, and forming at least one deep via within the first workpiece, wherein the at least one deep via provides vertical electrical connection for the first integrated circuit.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
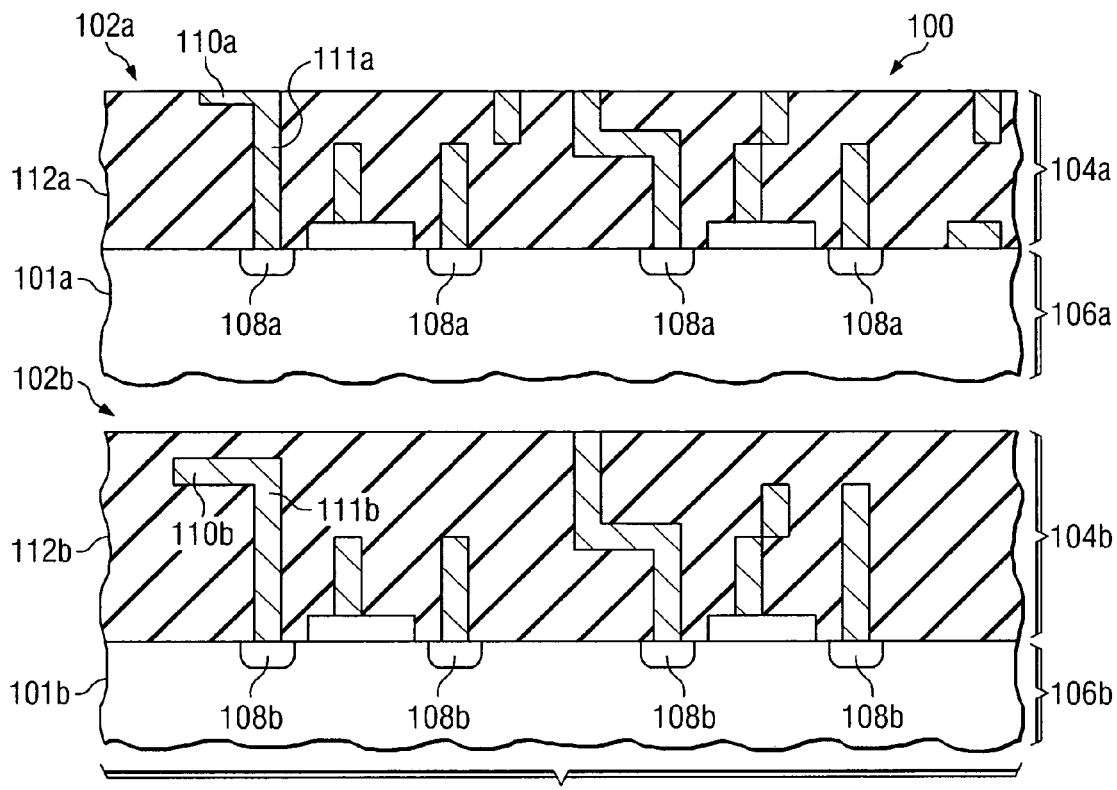
FIGS. 1 through 4 show cross-sectional views of a prior art method of fabricating a 3D-IC.

FIGS. 1 through 4 show cross-sectional views of a prior art method of fabricating a 3D-IC at various stages of manufacturing. Referring first to FIG. 1, two integrated circuits 102a and 102b are independently manufactured. For example, integrated circuit 102a comprises a workpiece 101a. Active areas 108a are formed within and over the workpiece 101a, as shown. The active areas 108a may include transistors, as shown, or the active areas 108a may comprise other devices or circuit components. The workpiece 101a and the active areas 108a are labeled 106a to indicate the portion of the integrated circuit 102a that is processed in a front end of line (FEOL) manufacturing process, e.g., before any metallization layers are deposited.

An interconnect region comprising conductive lines 110a and conductive vias 111a formed in an insulating material 112a is formed over the workpiece and the active areas 108a. The interconnect region may comprise one or more conductive layers within an insulating material layer, and may comprise a multi-layer interconnect region formed by subtractive etch processes or damascene processes, for example. The interconnect region is labeled 104a to indicate the portion of the integrated circuit 102a that is processed in the back end of line (BEOL), e.g., after the first metallization layer is deposited.

Integrated circuit 102b may comprise similar components and elements as integrated circuit 102a, as indicated by similar element numbers with a "b" suffix. Integrated circuit 102b may comprise a similar circuit or a different type of circuit as the circuit formed on integrated circuit 102a, for example.

Figure 2:
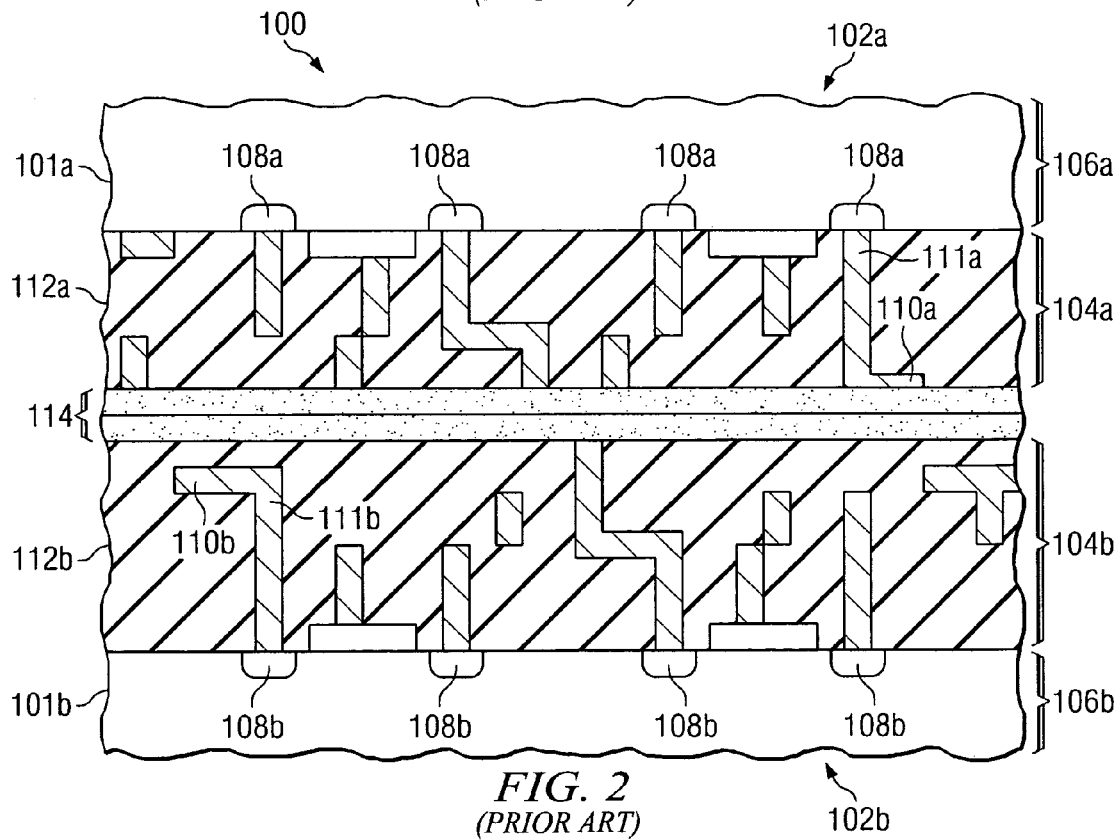

One prior art method of forming a 3D-IC 100 is to invert one integrated circuit 102a and bond the top surface of integrated circuit 102a to the top surface of integrated circuit 102b, as shown in FIG. 2. This type of vertical connection of two integrated circuits 102a and 102b is often referred to as "face-to-face" bonding. Integrated circuit 102a may comprise an entire wafer or a single die, and integrated circuit 102b typically comprises an entire wafer, for example, although alternatively, both the integrated circuit 102a and integrated circuit 102b may comprise single die. The integrated circuits 102a and 102b are bonded at a bond region 114, as shown, using an adhesive (e.g., comprising bond region 114), such as benzocyclobutene (BCB) or a polyimide, as examples. The integrated circuits 102a and 102b may also be bonded using oxide bonds (e.g., by bonding together the insulating materials 112a and 112b) or metal bonds (e.g., by bonding together some of conductive lines 110a and 110b), not shown.

Figure 3:
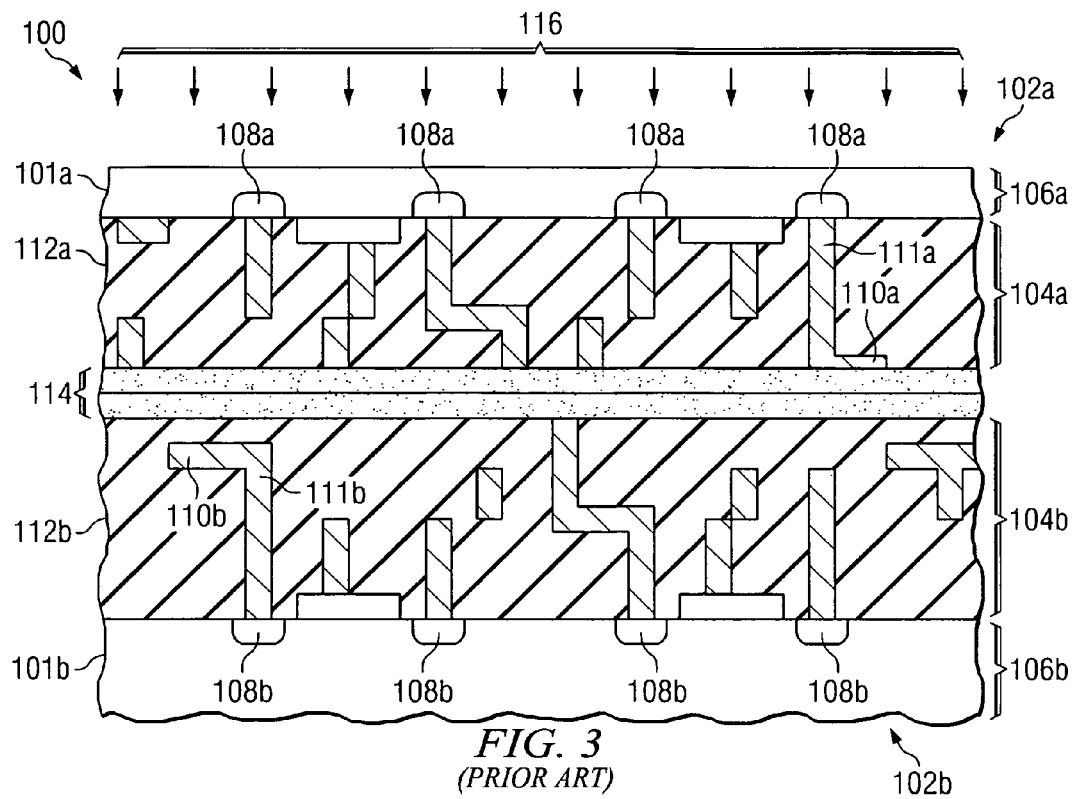
Figure 4:
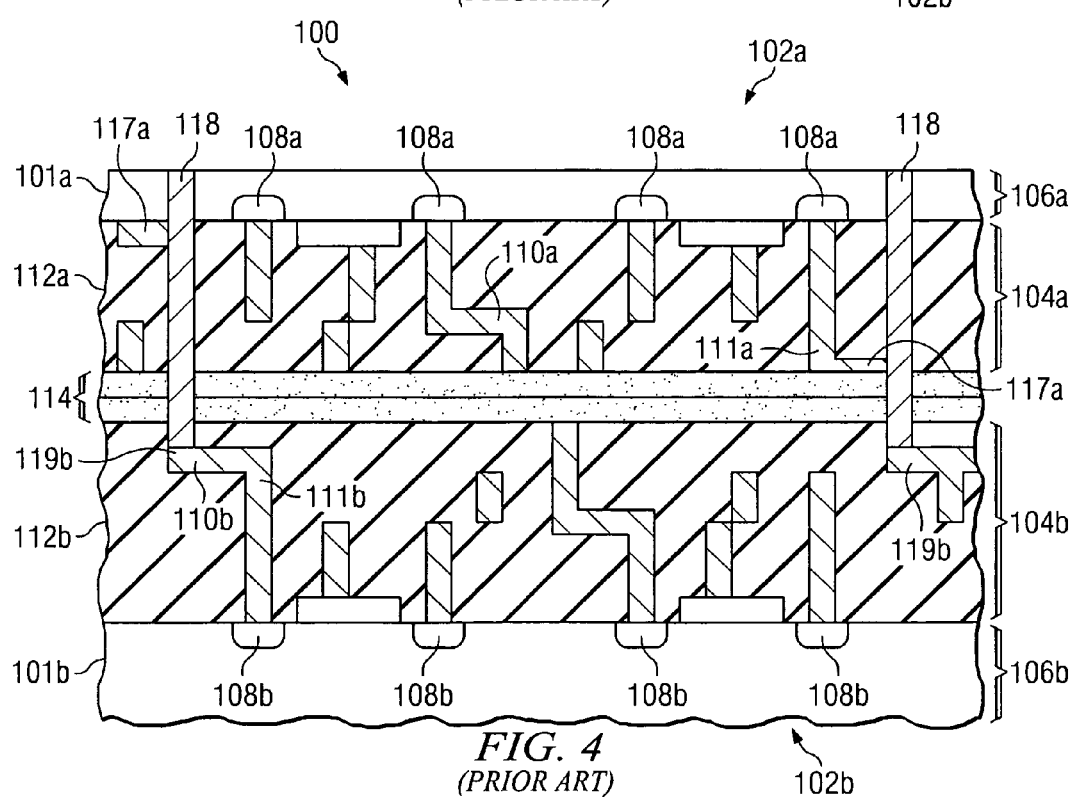
Figure 5:
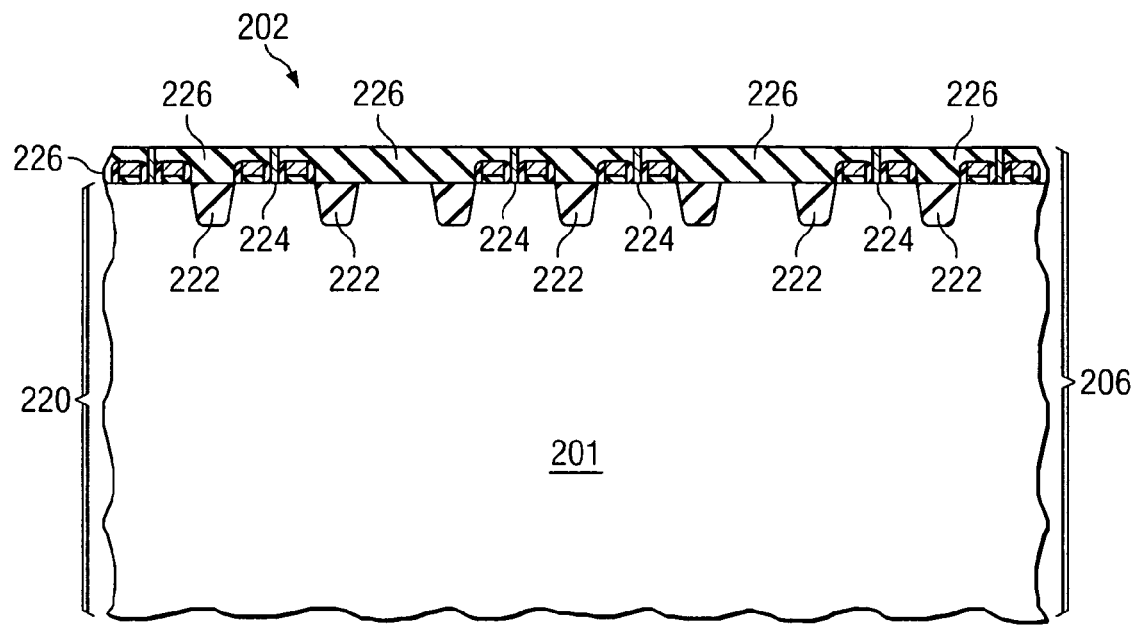
FIGS. 5 through 11 show cross-sectional views of a method of manufacturing a 3D-IC in accordance with a preferred embodiment of the present invention, wherein deep vias for vertical connection of the 3D-IC are formed within a top portion of a workpiece early in the manufacturing process, before the BEOL, and wherein two ICs are vertically coupled together face-to-face.

If an adhesive 114 or oxide-to-oxide bond is used to bond together the ICs 102a and 102b, then a vertical connection between the ICs 102a and 102b is required to be made, by forming deep vias within the IC 102a. To form the deep vias, the top surface, e.g., the workpiece 101a of the top integrated circuit 102a, is thinned, as shown in FIG. 3. For example, the workpiece 101a is ground, etched, and/or polished using a thinning process 116, reducing the thickness of the workpiece 101a. Then, deep vias 118 are formed in the top integrated circuit 102a, as shown in FIG. 4. The deep vias 118 extend through the entire thickness of the top integrated circuit 102a and through the bond region 114, and in some designs, extend partially through the bottom integrated circuit 102b, as shown. The deep vias 118 provide electrical connection between regions 117a in the top integrated circuit 102a and regions 119b in the bottom integrated circuit 102b, as shown.

To form the deep vias 118, a hard mask (not shown) is typically deposited over the thinned workpiece 101a, and a layer of photoresist is deposited over the hard mask and patterned with the desired pattern for the deep vias 118. The layer of photoresist is then used as a mask to pattern the hard mask. The hard mask is then used to pattern the various material layers 101a, 108a, 112a, 111a, and 110a of the top integrated circuit 102a, the bond region 114, and material layers (e.g., insulating material 112b) of the bottom integrated circuit 102b, forming trenches for the deep vias. An insulating liner is formed within the trenches (not shown in FIG. 4). The insulating liner is opened at the bottom of the trenches by directionally etching the liner, leaving the insulating liner on the sidewalls of the trenches. A conductive material is then deposited over the 3D-IC 100 to fill the deep vias 118, as shown in FIG. 4.

A problem with the prior art method of forming the deep vias 118 shown is that there are several material layers 101a, 108a, 112a, 111a, 110a, 114, and 112b that must be etched, causing the etch process to be lengthy, time-consuming, and costly. The etch process is also difficult to control. Because many different types of materials must be etched, the etch chemistries may need to be changed several times, e.g., about 10 to 15 or more times, because different etch chemistries are required to etch different material types.

Furthermore, the insulating liner on the sidewalls of the trenches for the deep vias 118 cannot be formed using a high temperature thermal nitridation process or by thermal oxidation, because the interconnect regions of the two ICs 102a and 102b include metals (e.g., conductive lines 110a, 110b, and vias 111a and 111b); thus, the temperature that the 3D-IC 100 may be exposed to is limited to about 400 degrees C. or less. A thermal nitridation process to form a layer of $Si_xN_y$ or a thermal oxidation process to form a liner of $SiO_2$ may require temperatures of about 700 degrees C. or more, for example. Thus, physical vapor deposition (PVD) or Plasma Enhanced Chemical Vapor Deposition (PE CVD) must be used to form the insulating liner, which results in the formation of an insulating liner having poor step coverage, poor quality, and poor bonding with the workpiece 102a.

If metal-to-metal bonds are used to connect the two integrated circuits 102a and 102b, deep vias are required to be made in the workpiece 101a of the top IC 102a, to make electrical contact to the active areas 108a or to the conductive lines 110a and vias 111a. While fewer material layers must be etched in this case to form the deep vias, high temperature processes may still not be used to form the insulating liner of the deep vias because of the presence of the metallization layers of the interconnect regions of the two ICs 102a and 102b, as described above.

Another method used to vertically integrate integrated circuits 102a and 102b is to bond two ICs 102a and 102b "front-to-back," e.g., wherein a bottom surface of one IC 102a is bonded to a top surface of another IC 102b (not shown in the drawings). In this method, the integrated circuit (e.g., such as IC 102a in FIG. 1) to be mounted on top of another integrated circuit 102b is mounted to a carrier wafer (not shown) on the top surface, and the bottom surface of the integrated circuit 102a, e.g., the workpiece 101a is reduced in thickness. Then the bottom surface of the thinned integrated circuit 102a is attached to the top surface of the other integrated circuit 102b. However, this method also requires etching many different material layers to form the deep vias for making electrical connection between the vertically stacked ICs, and forming the insulating liner within the trenches is limited to low temperature deposition methods.

Furthermore, in some prior art 3D-ICs, an additional signal distribution layer may be needed to make the required electrical connections, not shown in the drawings. The signal distribution layer comprises an additional interconnect layer that is used to make the vertical connections between the two ICs.

Thus, what are needed in the art are improved methods of fabricating 3D-ICs and providing electrical connection between vertically stacked ICs.

Embodiments of the present invention provide technical advantages by forming deep vias for providing electrical connection for vertically stacked integrated circuits early in the manufacturing process, before the integrated circuits are vertically attached to other integrated circuits. Thus, fewer material layers are required to be etched during the formation of the deep vias, which provides several advantages, to be described further herein. Furthermore, the deep vias are formed before any metals are deposited (e.g., before the BEOL), so that high temperature processes may be used to form an insulating liner on sidewalls of the trenches of the deep vias.

FIGS. 5 through 11 show cross-sectional views of a method of manufacturing a 3D-IC in accordance with a preferred embodiment of the present invention. First, a workpiece 201 is provided. The workpiece 201 may include a semiconductor substrate comprising silicon or other semiconductor materials covered by an insulating layer, for example. The workpiece 201 may also include other active components or circuits, not shown. The workpiece 201 may comprise silicon oxide over single-crystal silicon, for example. The workpiece 201 may include other conductive layers or other semiconductor elements, e.g., transistors, diodes, etc. Compound semiconductors, GaAs, InP, Si/Ge, or SiC, as examples, may be used in place of silicon. The workpiece 201 may comprise a silicon-on-insulator (SOI) substrate, for example.

An upper portion 220 of the workpiece 201 is shown in the figures. The workpiece 201 may comprise a thickness of about 600 μm, yet only the upper 25 μm is shown in the drawings, for example.

Active areas 222/224 are formed proximate the top surface of the workpiece 201, as shown. For example, transistors 224 may be formed proximate the workpiece 201 top surface, e.g., by implanting dopant regions within the top surface of the workpiece 201, and forming gate dielectrics, gates, and sidewall spacers over the doped regions. The transistors 224 may be separated by isolation regions 222 formed in the top surface of the workpiece 201 between adjacent transistors 224, also shown. The isolation regions 222 may comprise a depth within the top surface of the workpiece 201 of about 2,000 Angstroms or less, for example, although alternatively, the isolation regions 222 may comprise a depth of greater than 2,000 Angstroms.

The transistors 224 may comprise p channel field effect transistors (PFETs) and n channel field effect transistors (NFETs) arranged in complementary configurations, e.g., to form complementary metal oxide semiconductor (CMOS) devices, for example. The transistors 224 may also comprise bipolar transistors or other thin film transistors, or combinations thereof with CMOS devices, as examples. An insulating material 226 comprising silicon dioxide or other dielectric material may be deposited over the active areas 222/224, as shown. The active areas 222/224 are preferably formed using FEOL processes (e.g., region 206 is formed in a FEOL), for example. The active areas 222/224 may comprise transistors, as shown, and alternatively may comprise memory devices, switches, diodes, capacitors, logic circuits, other electronic components, or combinations thereof with transistors (not shown), formed within and above the workpiece 201, as examples.

Figure 6:
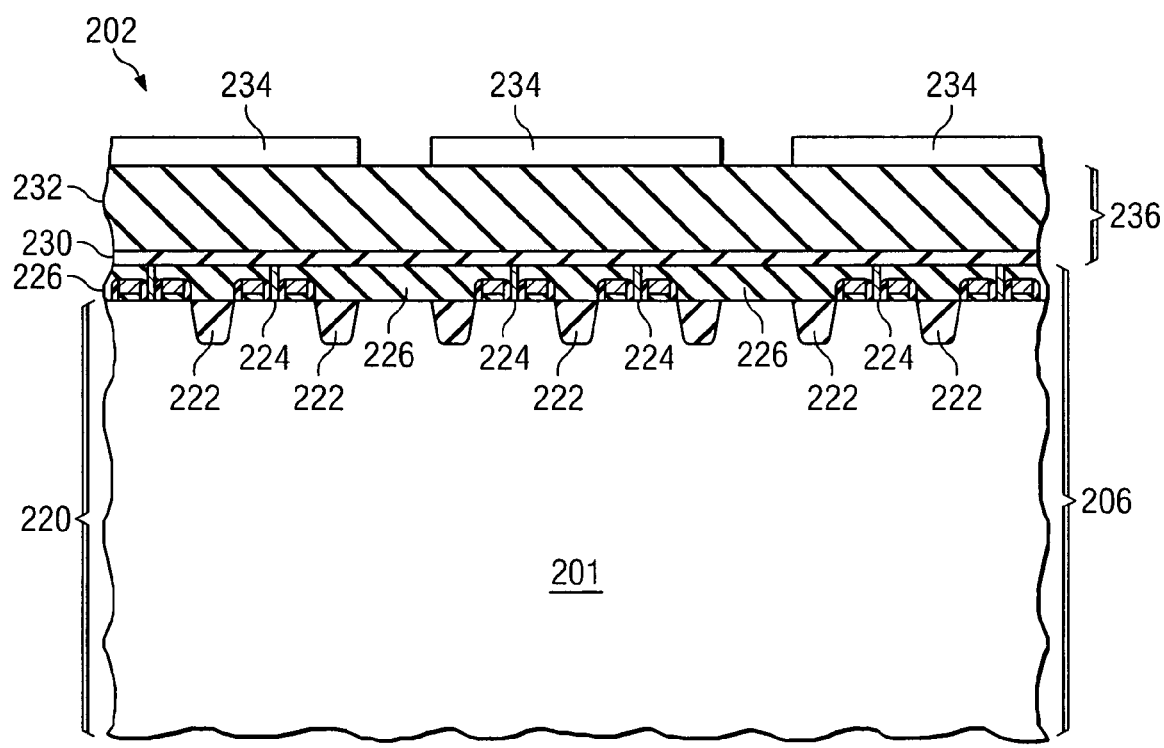
Figure 7:
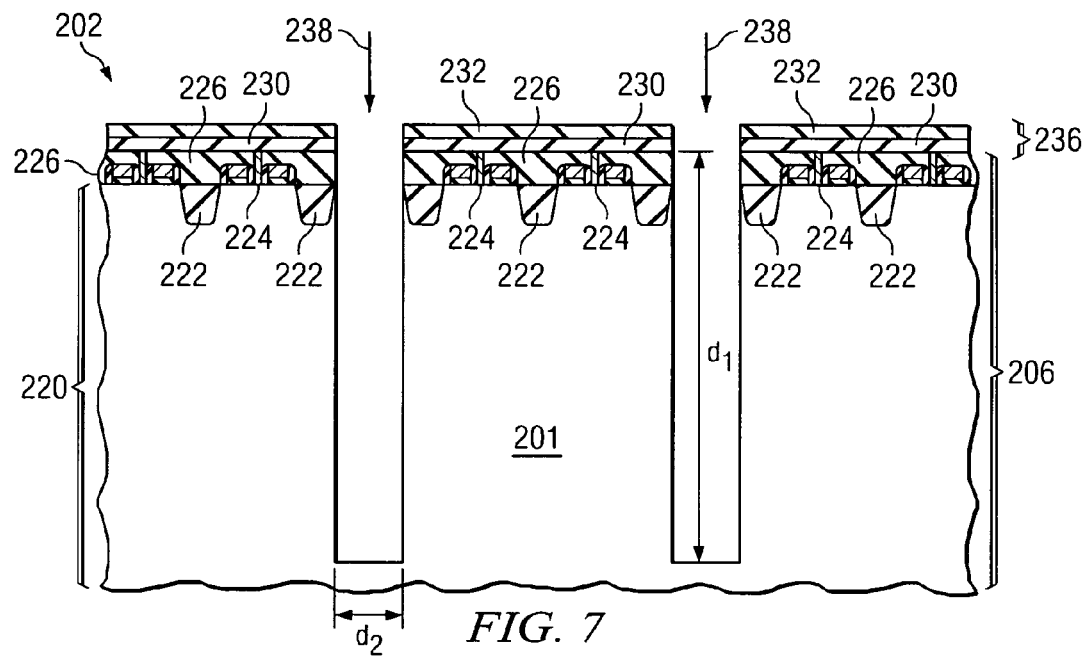
Figure 8:
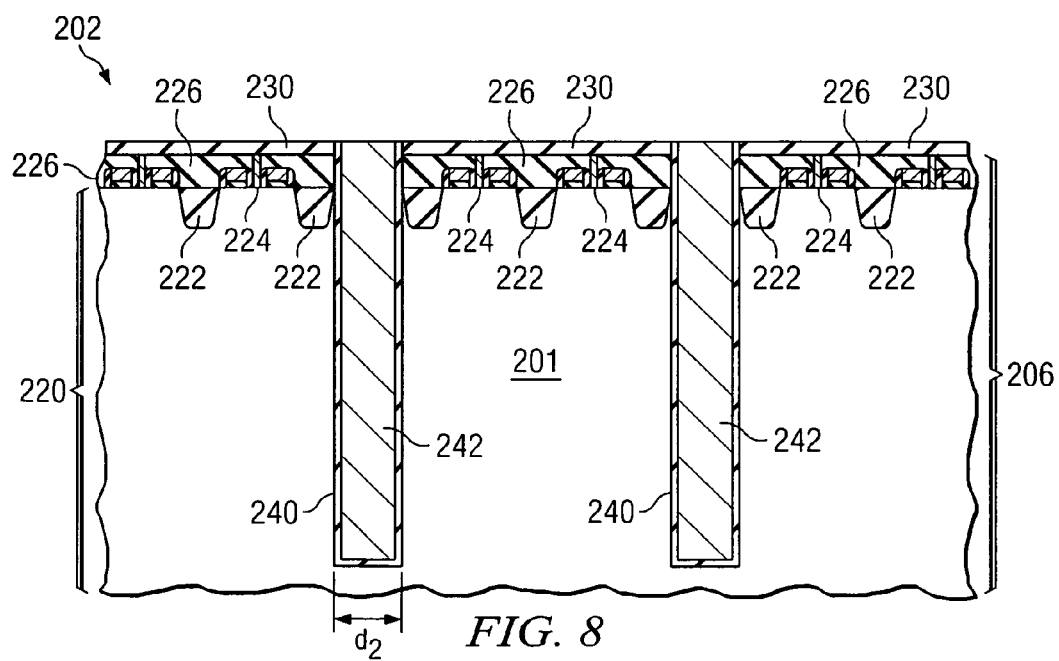

After the FEOL process is completed for the integrated circuit 202, next, deep vias for vertical integration of a 3D-IC device are formed in the top portion 220 of the workpiece 201, as shown in FIGS. 6 through 8. To form the deep vias in the top portion 220 of the workpiece 201, a hard mask 236 is deposited over the active areas 222/224 and insulating material 226, as shown in FIG. 6. The hard mask 236 preferably comprises a first layer 230 that may function as an etch stop layer, comprised of a nitride material such as silicon nitride, silicon carbon, or other insulating material different than the second layer 232 material, for example.

The hard mask 236 preferably also includes a second layer 232 disposed over the first layer 230, as shown. The second layer 232 may comprise an oxide, a doped oxide, or other masking materials such as boron-doped silicon glass (BSG), as examples. The hard mask 236 may comprise a thickness of about 1 μm, although alternatively, the hard mask 236 may comprise other dimensions. The hard mask 236 may alternatively comprise a single type of material, a single layer, or three or more material layers, as examples.

A layer of photoresist 234 is deposited over the hard mask 236. The layer of photoresist 234 is patterned using lithography (e.g., by exposing portions the layer of photoresist 234 using a lithography mask, and developing the layer of photoresist 234) with the desired shape of the deep vias, as shown in FIG. 6. The pattern for the deep vias preferably comprises a width of about 0.5 to 3.0 μm, and more preferably comprises a width of about 1.0 μm in this embodiment, as examples, although alternatively, the width of the deep vias may comprise other dimensions.

The layer of photoresist 234 is then used to pattern the hard mask 236. For example, the layer of photoresist 234 is used as a mask while exposed portions of the hard mask 236 are removed, as shown in FIG. 7. The layer of photoresist 234 may be left remaining over the hard mask 236 after the hard mask 236 is patterned, or the layer of photoresist 234 may be partially or completely consumed during the patterning of the hard mask 236.

The hard mask 236 and optionally also the photoresist 234 is then used as a mask to pattern trenches for deep vias in the insulating layer 226, active areas 222/224, and in a top portion 220 of the workpiece 201, as shown in FIG. 7. The etch process 238 to form the deep vias preferably comprises a dry etch process, although other etching methods may also be used. The trenches for the deep vias preferably comprise a depth $d_1$ of about 5 to 25 μm, and more preferably comprise a depth $d_1$ of about 20 μm, below the active areas 222/224 of the workpiece 201, as shown. Alternatively, depth $d_1$ of the trenches for the deep vias may comprise other dimensions. The width $d_2$ of the trenches for the deep vias preferably comprises substantially the same width as the pattern of the layer of photoresist, as shown.

A portion of the hard mask 236 may be consumed during the etch process used to form the trenches for the deep vias, e.g., the thickness of the second layer 232 of the hard mask 236 may be reduced after the etch process 238. At least a portion of the hard mask 236 may be removed. For example, the second layer 232 of the hard mask 236 may be removed, e.g., using a dry or wet etch process, or a chemical-mechanical polish (CMP) process adapted to stop on the first layer 230 that functions as an etch stop layer for the removal of the second layer 232, as examples. The first layer 230 may be left remaining in the structure, or alternatively, the first layer 230 may also be removed.

Next, a liner 240 is formed within the trenches for the deep vias, and the trenches for the deep vias are filled with a conductive material 242, as shown in FIG. 8. The liner 240 is formed on the sidewalls and bottom surface of the trenches for the deep vias, as shown in FIG. 8. The liner 240 preferably is formed by a thermal process, e.g., by thermal nitridation or thermal oxidation at temperatures greater than about 400 degrees C., and in some embodiments, the liner 240 is formed at temperatures greater than about 700 degrees. The liner 240 may be formed by oxidation, nitridation, deposition, or combinations thereof, for example. The liner 240 preferably comprises an insulating material disposed on the sidewalls and bottom surface of the trenches.

The liner 240 may also optionally include one or more barrier layers, a seed layer, or both, formed over the insulating material, for example. The liner 240 may comprise a thickness of about 500 Angstroms or less, for example. The liner 240 may comprise $SiO_2$, $Si_xN_y$, SiON, other nitride materials, Ta, TaN, TiN, Cu, Ru, combinations thereof, or multiple layers thereof, as examples, although other materials may also be used.

Advantageously, because metallization layers have not been deposited yet, a relatively high temperature, e.g., greater than about 400 degrees C., may be used to form at least a portion of the liner 240. More preferably, an insulating portion of the liner 240 is formed at a temperature of about 700 degrees C. or greater, in accordance with an embodiment of the present invention. Thus, the formation of the novel deep vias is not restricted to temperature limits for BEOL processes, advantageously. Furthermore, the liner 240 may be left remaining on the bottom surface of the trenches, e.g., the insulating portion of the liner 240 is not required to be removed from the bottom surface of the trenches for the deep vias.

If the conductive material 242 comprises copper, the liner 240 preferably comprises a material suitable to provide a barrier for diffusion of the copper into adjacent material such as the workpiece 201 and the active areas 222/224, for example. In this embodiment, the liner 240 preferably comprises a diffusion barrier layer of Ta, TaN, or both, e.g., a bilayer of Ta/TaN. Furthermore, the liner 240 may include a seed layer comprising Cu or Ru, for example, for the formation of the copper conductive material 242, if a plating process is used to fill the trenches, for example. The liner 240 may comprise a thin layer of $SiO_2$, $Si_xN_y$, or other insulating material formed within the trenches before the seed layer and/or diffusion barrier layer is formed, for example.

The conductive material 242 and liner 240 may be formed by: first; forming the liner 240 over the top surface of the first layer 230 of the hard mask and over the sidewalls and bottom surface of the trenches, using chemical vapor deposition (CVD), physical vapor deposition (PVD), atomic layer deposition (ALD), or other deposition techniques, and second; depositing or plating the conductive material 242 over the liner 240, filling the trenches and covering the liner 240 on the top surface of the first layer 230 (or insulating material 226 if the first layer 230 of the hard mask 236 has been removed). The conductive material 242 may comprise Cu, W, Ru, TiN, combinations thereof, other metals, combinations of two or more metals, or a semiconductive material such as silicon, doped silicon, or polysilicon, as examples. A CMP process may then be used to remove excess conductive material 242 and the liner 240 from over the top surface of the first layer 230 of the hard mask 236, leaving the structure shown in FIG. 8.

Figure 9:
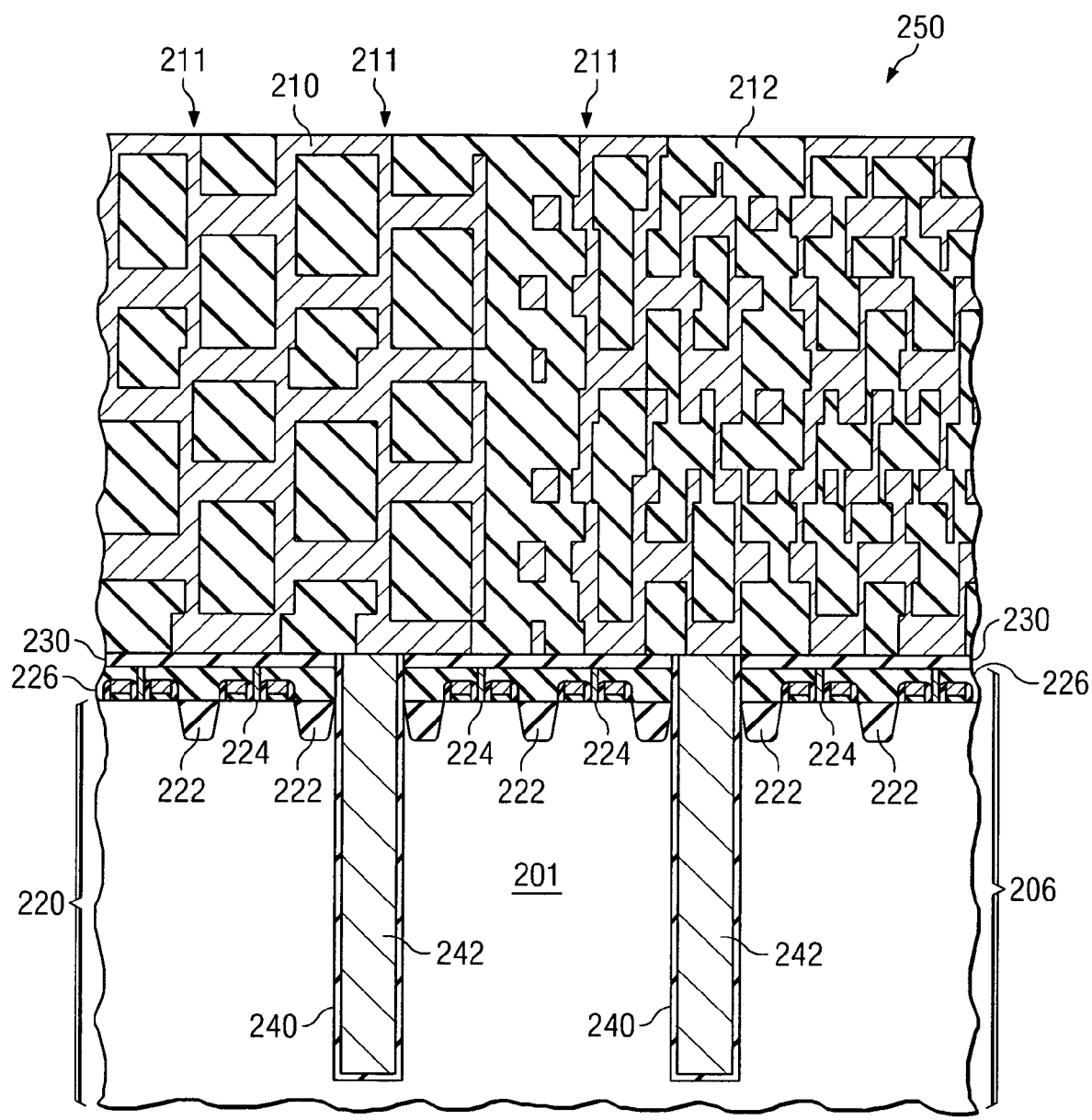

A BEOL process is then used to form an interconnect region 210/211/212 over the workpiece 201, e.g., over the first layer 230 of the hard mask, if left remaining in the structure, as shown in FIG. 9, or over the insulating material 226, if the first layer 230 has been removed. The BEOL process may comprise forming a plurality of insulating material layers 212 and forming alternating layers of vias 211 and conductive lines 210 in the insulating material layers 212, e.g., using subtractive etch processes and/or damascene etch processes. The insulating material layers 212 may include etch stop layers, $SiO_2$ layers, other insulating materials, and/or low dielectric constant (k) materials, e.g., having a dielectric constant of less than about 3.9, for example. The conductive lines 210 and vias 211 may comprise Cu, W, other metals, or combinations thereof, as examples. The interconnect region 210/211/212 preferably comprises at least one layer of conductive lines 210 disposed within an insulating material layer 212, although in other embodiments, the interconnect region 210/211/212 preferably comprises a plurality of conductive line 210 layers and via 211 layers disposed within a plurality of insulating material layers 212, as shown in FIG. 9.

Note that if the filling of the deep via trenches comprises filling the trenches with a metal, then the BEOL process effectively begins with the filling of the deep via trenches, in this embodiment, because a first metal layer is deposited with the filling of the deep via trenches. The distinction of a BEOL process from a FEOL process may be important in some applications. FEOL processes include high temperature processes such as anneal processes that cannot be performed after some metals are deposited, for example. The maximum temperature of a BEOL process may be about 400 degrees C., whereas temperatures may reach about 1,050 degrees C. in some FEOL processes, for example.

Figure 12:
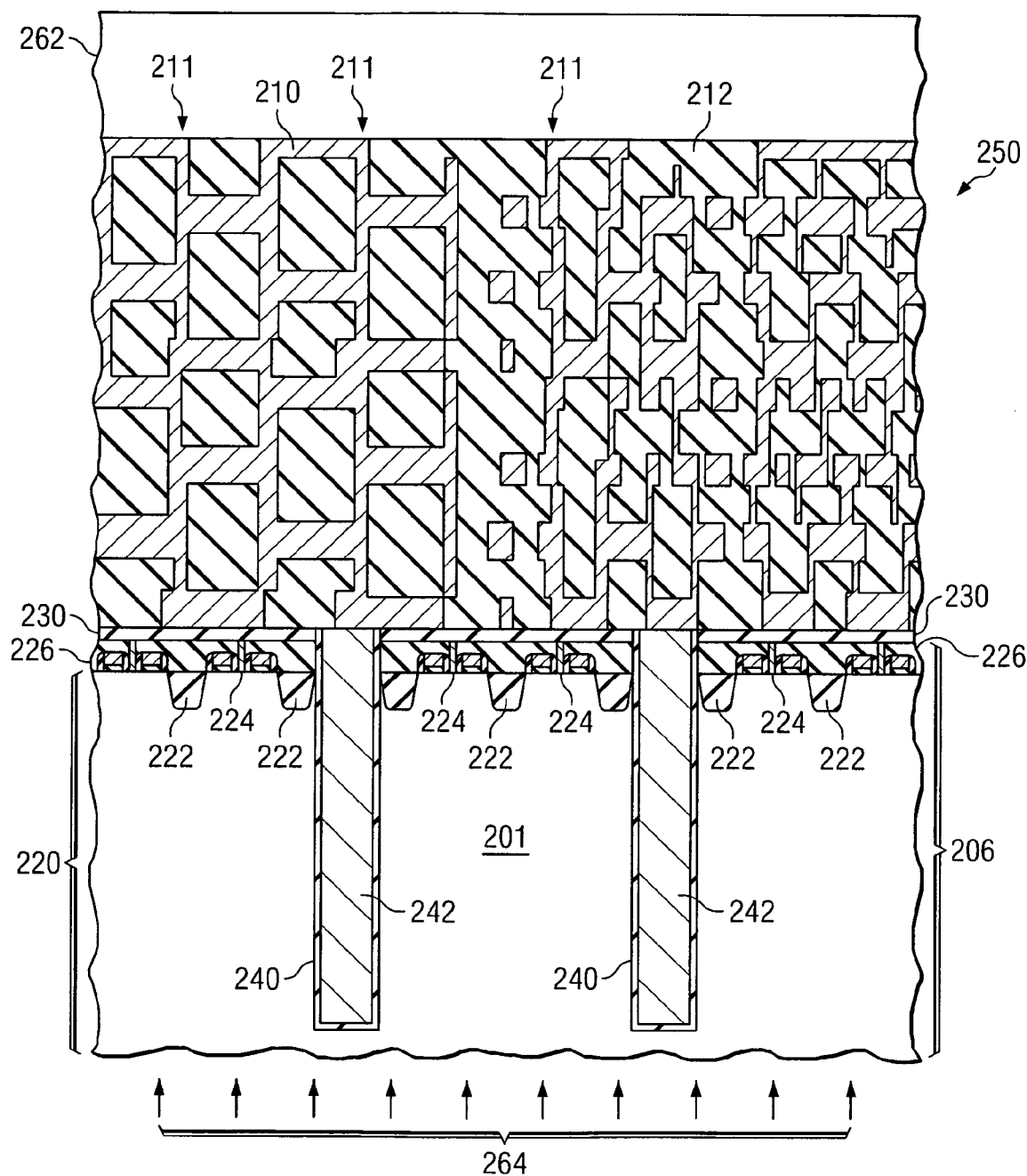
FIGS. 12 through 14 show cross-sectional views of a method of manufacturing a 3D-IC in accordance with another preferred embodiment of the present invention, wherein two ICs are vertically coupled together back-to-face.
Figure 13:
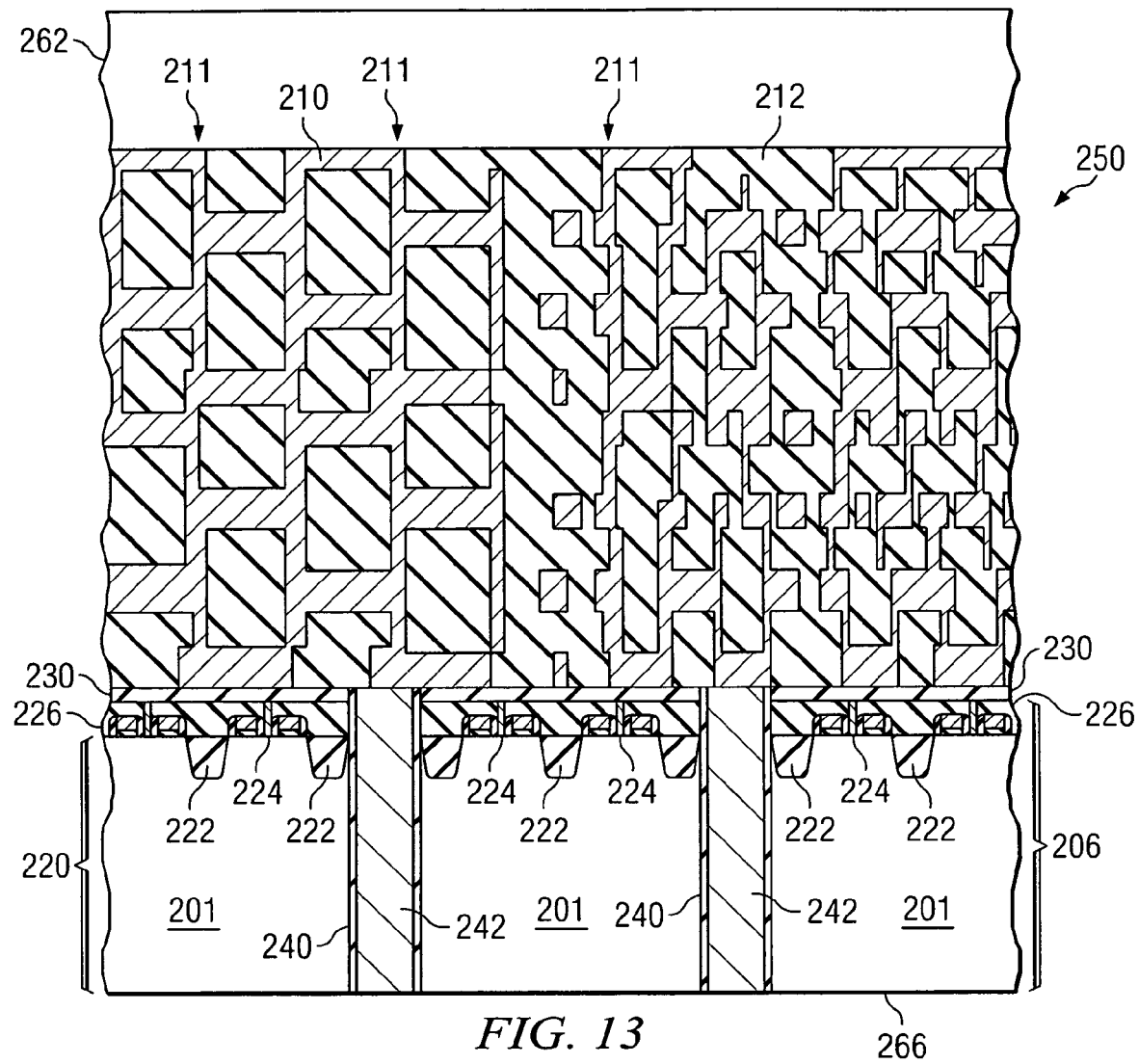
Figure 14:
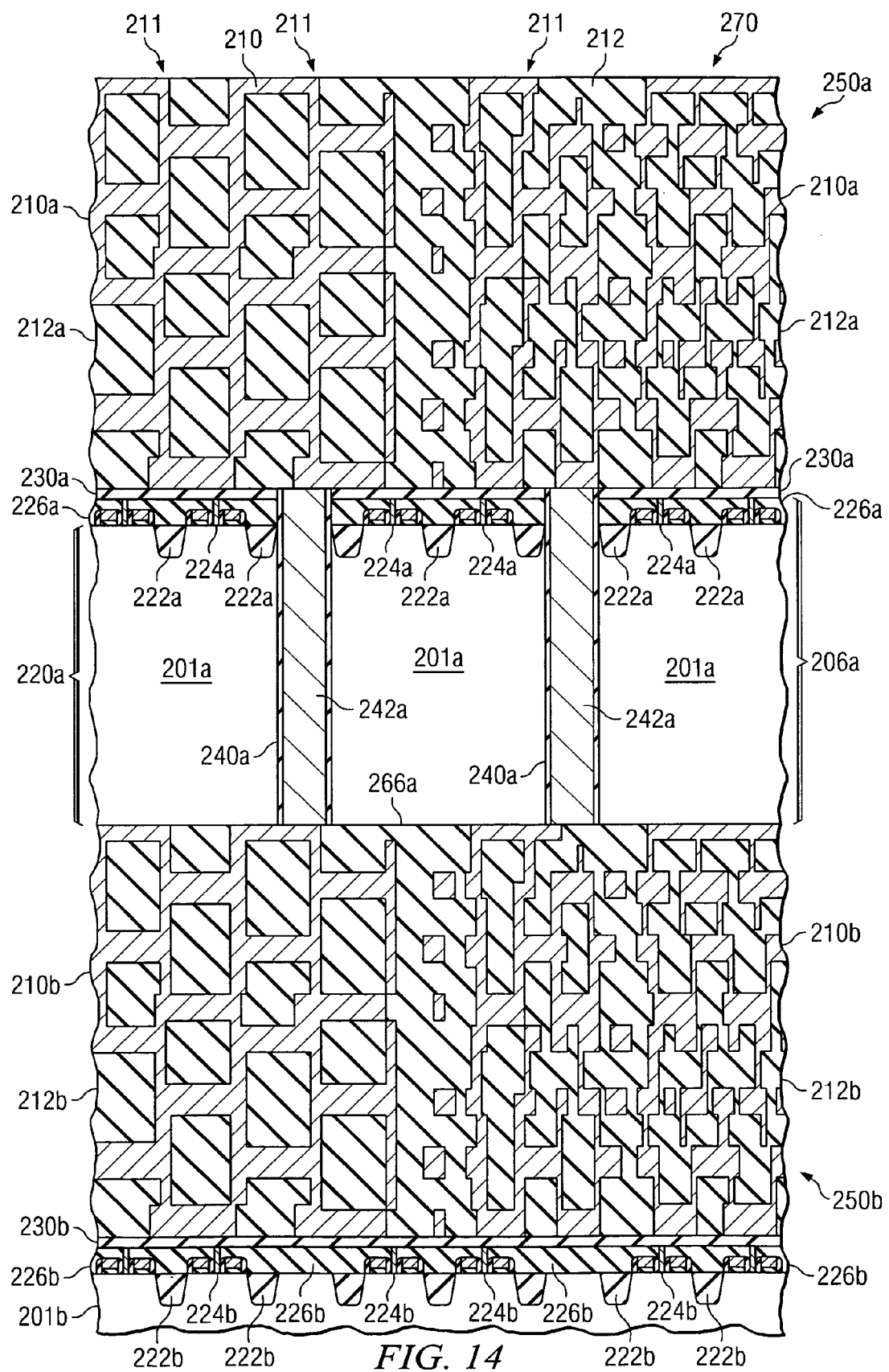

Thus, a novel IC 250 is formed having deep vias 240/242 formed in a top portion 220 of the workpiece 201, as shown in FIG. 9, in accordance with embodiments of the present invention. Advantageously, the deep vias 240/242 have been formed before the IC 250 is vertically integrated to another workpiece or IC 250. The deep vias 240/242 are formed in the workpiece 201 after the formation of the active areas 222/224 in this embodiment. The IC 250 may be vertically attached face-to-face (top surface to top surface) to another IC, as shown in FIGS. 10 and 11, or back-to-face, (bottom surface to top surface) to another IC, as shown in FIGS. 12 through 14, as will next be described.

Figure 10:
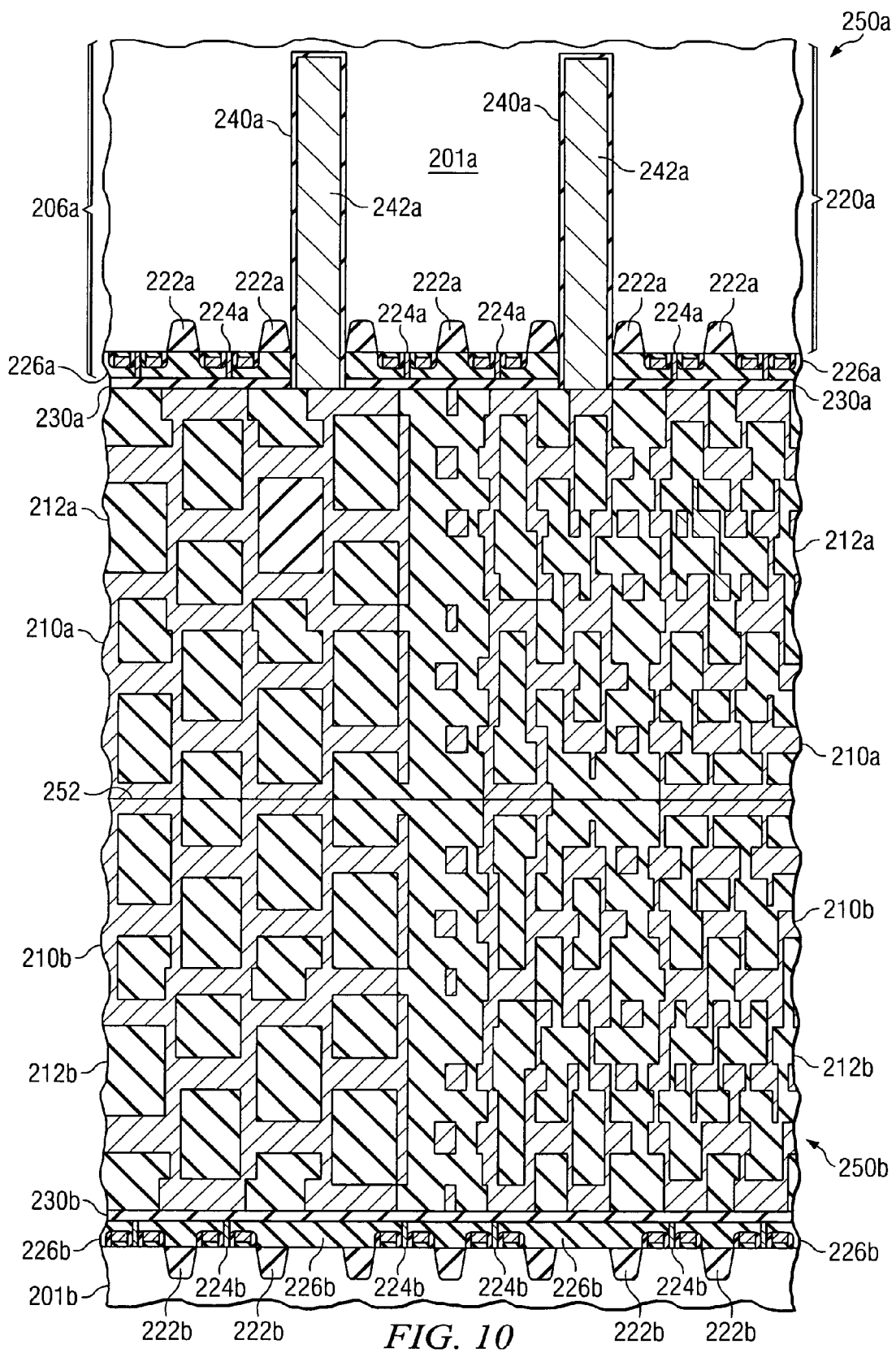
Figure 11:
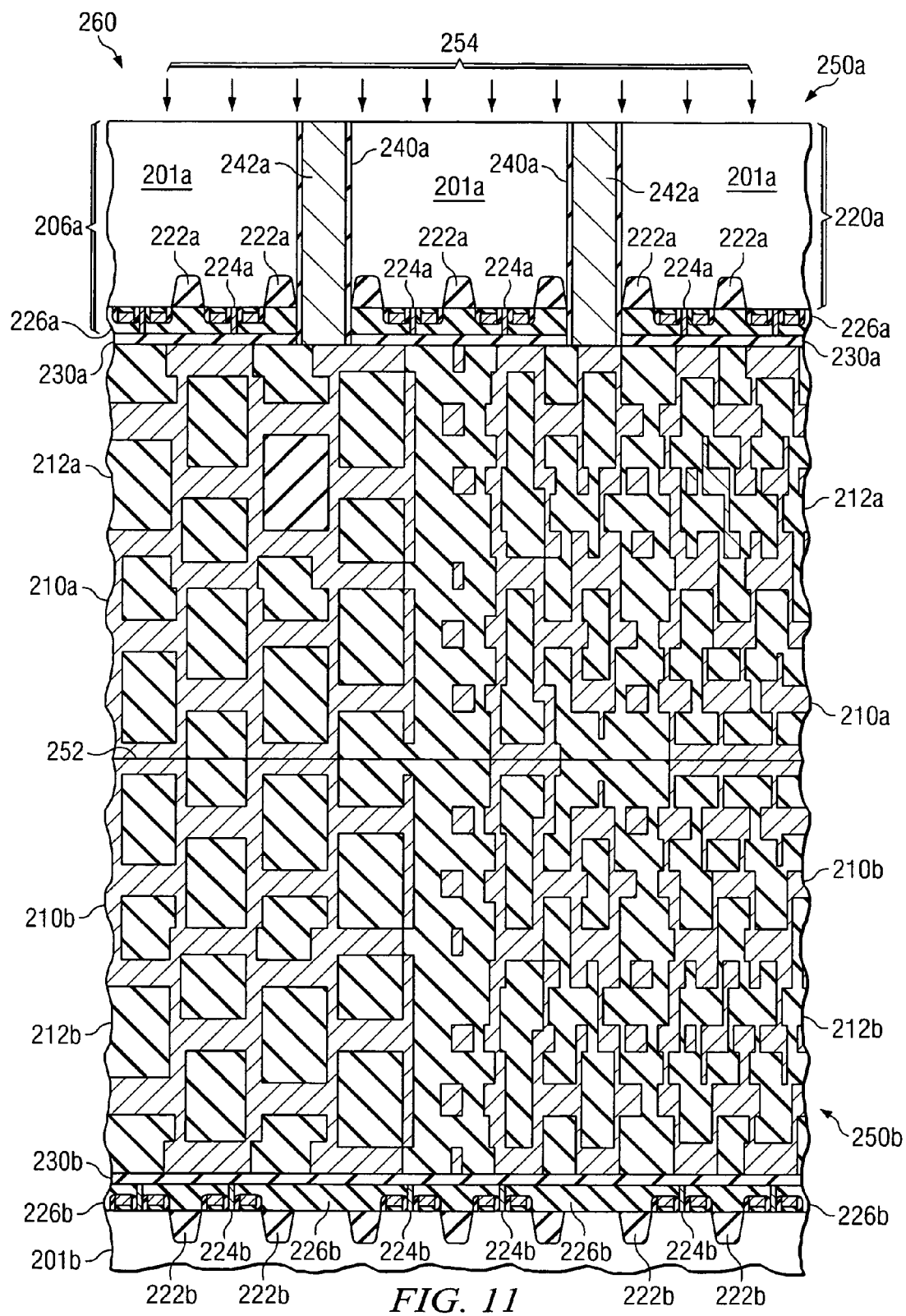

Face-to-face vertical attachment of the novel IC 250 to another IC in accordance with an embodiment of the present invention is illustrated in FIGS. 10 and 11. A first integrated circuit 250a is attached to a second integrated circuit 250b by bonding the top surface of the first interconnect region 210a/211a/212a to the top surface of the second interconnection region 210b/211b/212b, e.g., at 252, as shown in FIG. 10.

The bonding of the first interconnect region 210a/211a/212a to the second interconnection region 210b/211b/212b preferably comprises a metal-to-metal bond that provides electrical connection between portions of the first interconnect region 210a/211a/212a to the second interconnection region 210b/211b/212b. The metal-to-metal bonds may be formed by activating the surfaces of the conductive lines 210a and 210b, positioning the ICs 250a and 250b so that some of the conductive lines 210a and 210b align, and applying temperature and/or pressure to the ICs 250a and 250b to bond the conductive lines 210a and 210b together, for example. For such a direct bonding the mating surfaces (e.g., the surfaces of the conductive lines 210a and 210b, and also the insulating materials 212a and 212b) are preferably extremely clean, smooth, (e.g., preferably having a surface roughness of less than about 10 Å root mean square (RMS)) and globally coplanar. Preferably, for example, an adhesive is not used for the face-to-face bonding, so that electrical connection of the conductive lines 210a and 210b of the first interconnect region 210a/211a/212a and the second interconnection region 210b/211b/212b, respectively, is achieved.

Next, the workpiece of the top IC 250a is thinned using a thinning process 254, as shown in FIG. 11, removing a portion of the workpiece 201a, e.g., the lower portion (which appears as an "upper" portion in FIG. 10 because the workpiece 201a has been inverted) of the workpiece 201a. The thinning process 254 may comprise an etch process, a grinding process, a CMP process, a polishing process, or combinations thereof, as examples. The upper portion 220a of the workpiece is left remaining, with the ends of the deep vias 242a/240a left exposed. The remaining thickness of the upper portion 220a of the workpiece 201 may comprise about 25 μm or less, for example. The deep vias 240a/242a provide electrical connection through the workpiece 201a to the active areas 222a/224a.

Advantageously, at least the insulating portion of the liner 240 is removed from the ends of the deep vias 240a/242a during the thinning process 254 so that the exposed ends of the deep vias 240a/242a are conductive and may be connected to other circuitry, e.g., to an external connection of the 3D-IC 260 (not shown), or vertically to another IC 250, for example (also not shown). Bond pads (not shown) may be formed over the ends of the deep vias 240a/242a, and a passivation layer (not shown) may be deposited between the bond pads. The bond pads may be positioned adjacent the ends of the deep vias 240a/242a, providing an electrical connection. The workpiece 201b of the bottom IC 250b may be thinned by attaching the top of the 3D-IC to a carrier wafer or workpiece and thinning the workpiece 201b, wherein after the thinning process, the bottom workpiece 201b comprises a thickness of about 300 μm, for example.

The 3D-IC 260 may be placed in a package or circuit board, e.g., by attaching the bottom surface of the workpiece 201b to the package or circuit board. Wires may then be bonded to the bond pads, and the other end of the wires may be attached to pins of the package or other ICs attached to the circuit board. The lower workpiece 201b may be grounded or coupled to a return voltage, for example. The deep vias 240a/242a provide electrical connection to the conductive portion 224a of the active areas 222a/224a of the top IC 250a through the workpiece 201a. The deep vias 240a/242a also provide electrical connection to the conductive portion 224b of the active areas 222b/224b of the bottom IC 250b, e.g., through the conductive lines and vias 210a, 211a, 210b, and 211b.

Thus, a 3D-IC 260 is formed, wherein two ICs 250a and 250b are bonded together at their interconnect regions 210a/211a/212a and 210b/211b/212b, and wherein at least one of the ICs 250a comprise deep vias 240a/242a formed in the workpiece 201a to provide electrical connection to the active areas 222a/224a. In the drawings shown in FIGS. 10 and 11, the lower IC 250b does not include a novel deep via described herein; however, similar element numbers are used in the lower IC 250b as in the upper IC 250a. Note that both ICs 250a and 250b may have deep vias 240a/242a formed therein (not shown in IC 250b). In this embodiment, the lower IC 250b would include deep vias (not shown), and before or after the workpiece 201a is thinned for IC 250a, the workpiece 201b of the lower IC 250b is thinned by attaching a carrier wafer (see carrier wafer 262 shown in FIG. 12) to the workpiece 201a of IC 250a, and then thinning the workpiece 201b to expose the ends of the deep vias, as described with reference to FIG. 11, using a thinning process 254.

Back-to-face vertical attachment of the novel IC 250 to another IC in accordance with an embodiment of the present invention is illustrated in FIGS. 12 through 14. First, an integrated circuit 250 is attached to a carrier wafer 262 at the top surface of the interconnect region 210/211/212, as shown in FIG. 12. The carrier wafer 262 may comprise a semiconductor wafer or workpiece blank that is used to support the IC 250 and provide handling capability during the thinning of the workpiece 201, for example. The workpiece 201 is thinned using a thinning process 264, as shown in FIG. 12, leaving the ends of the deep vias 240/242 exposed on the thinned surface 266 of the workpiece 201, as shown in FIG. 13. The thickness of the workpiece 201 after the thinning process preferably comprises about 20 μm or less, for example.

Note that the thinning processes 254 and 264 described herein may include an end point detection means, e.g., so that the process may be stopped when the deep via 240/242 material is reached, or stopped after a predetermined time after the deep vias 240/242 material is reached. Alternatively, the thinning processes 254 and 264 may comprise a timed thinning process, for example. The insulating portion of the deep vias 240/242, e.g., at least a portion of the liner 240 is preferably removed during the thinning process 264.

Referring next to FIG. 14, after the workpiece 201 shown in FIG. 13 is thinned, the thinned surface 266a of the workpiece 201a of the integrated circuit 250a is then vertically coupled, e.g., attached or bonded to another integrated circuit 250b. In FIG. 14, the lower IC 250b does not include a novel deep via described herein; however, similar element numbers are used in the lower IC 250b as in the upper IC 250a. Note that both ICs 250a and 250b may have deep vias 240a/242a formed therein (not shown in IC 250b), as described with reference to FIG. 11.

The deep vias 240a/242a preferably make electrical connection to a portion of the interconnect region 210b/211b/212b, e.g., to a top portion of conductive lines 210b, as shown. The conductive lines 210b may be bonded to the exposed ends of the deep vias 240a/242a by metal-to-metal bonds, for example. Thus, a 3D-IC 270 is formed wherein the deep vias 240a/242a provide vertical electrical connection between conductive portions 224a of the active areas 222a/224a and conductive portions 224b of the active areas 222b/224b of the two ICs 250a and 250b, respectively, e.g., through conductive lines 210b and vias 211b. As described with reference to the 3D-IC 260 shown in FIG. 11, electrical connection may be made to the interconnect region 210a/211a/212a of the upper IC 250a by external circuitry or bond pads or vertically by another IC (not shown). The conductive lines 210a may be coupled to bond pads of the device, for example, not shown. The workpiece 201b may be thinned and mounted to a package or circuit board, and the carrier wafer 262 (shown in FIG. 13) is removed.

FIGS. 15 through 20 show cross-sectional views of a method of manufacturing a 3D-IC in accordance with yet another embodiment of the present invention, wherein the novel deep vias described herein are formed even earlier in the manufacturing process of the IC 380. In this embodiment, the deep via trenches are formed simultaneously with the formation of other trenches of the semiconductor device in the FEOL, before the formation of transistors and other active areas. For example, in many types of semiconductor device fabrication, deep trenches may be formed during the FEOL. Deep trenches may be used to form capacitors in memory arrays and other structures, as examples. Deep trenches may also be used to form isolation structures, for example. These deep trenches may have a depth of about 10 nm or less within a top surface of a workpiece, for example, and may comprise a minimum feature size or larger.

Like numerals are used for the various elements that were described in FIGS. 5 through 14. To avoid repetition, each reference number shown in FIGS. 15 through 20 is not described again in detail herein. Rather, similar materials x01, x30, x32, etc . . . are preferably used for the various material layers shown as were described for FIGS. 5 through 14, where x=2 in FIGS. 5 through 14 and x=3 in FIGS. 15 through 20. As an example, the preferred and alternative materials and dimensions described for the hard mask 236 in FIG. 6 are preferably used for hard mask 336 of FIG. 15.

Figure 15:
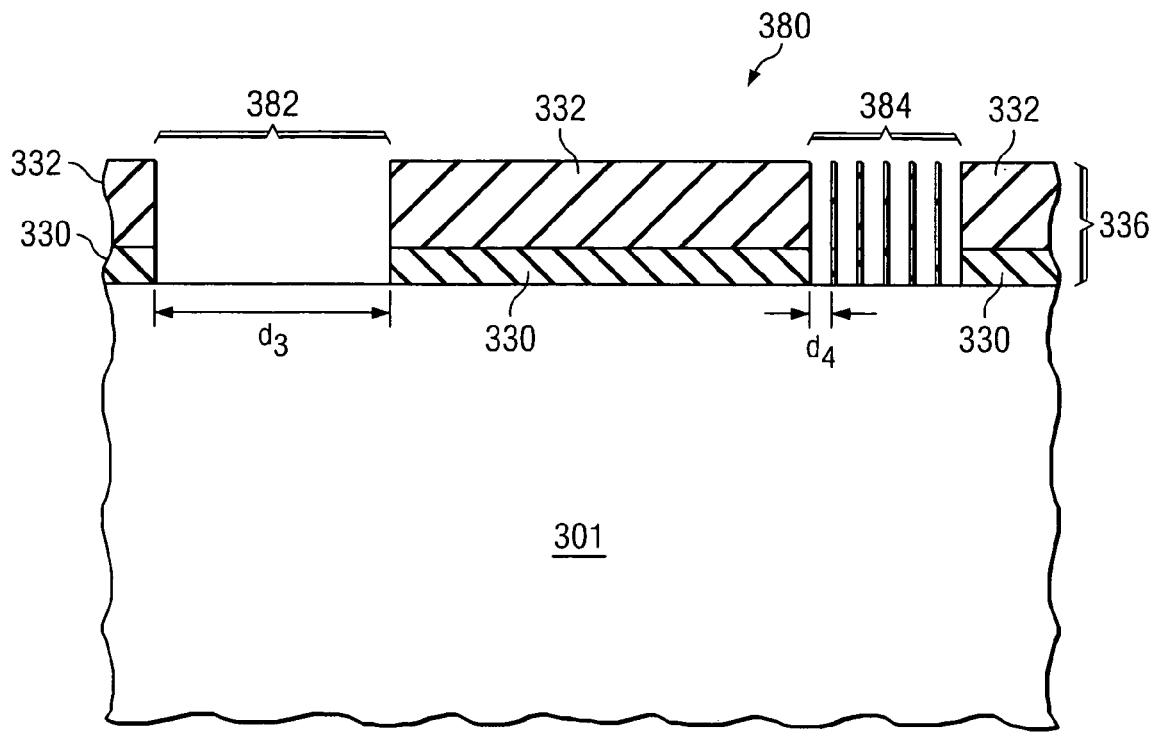
FIGS. 15 through 20 show cross-sectional views of a method of manufacturing a 3D-IC in accordance with yet another embodiment of the present invention, wherein deep vias are formed before active areas are formed within the workpiece, simultaneously with the formation of trenches for other features of the IC.

Referring to FIG. 15, a workpiece 301 is provided. A hard mask 336 is formed over the workpiece 301. The hard mask 336 may include a first layer 330 and a second layer 332, and alternatively may comprise a single layer or two or more layers. The hard mask 336 is patterned with a pattern 382 for deep vias and also a pattern 384 for trenches of other structures of the integrated circuit 380, as shown. The trenches of the pattern 382 for the deep vias preferably comprise a width $d_3$ that is greater than the width $d_4$ of the trenches of pattern 384, as shown. In this embodiment, the width $d_3$ of the deep via trenches may comprise about 5 to 25 µm or less, and the width $d_4$ of the trenches of the pattern 384 may comprise a minimum feature size of the integrated circuit 380, e.g., about 400 nm or less, e.g., 70 to 90 nm or less.

Figure 16:
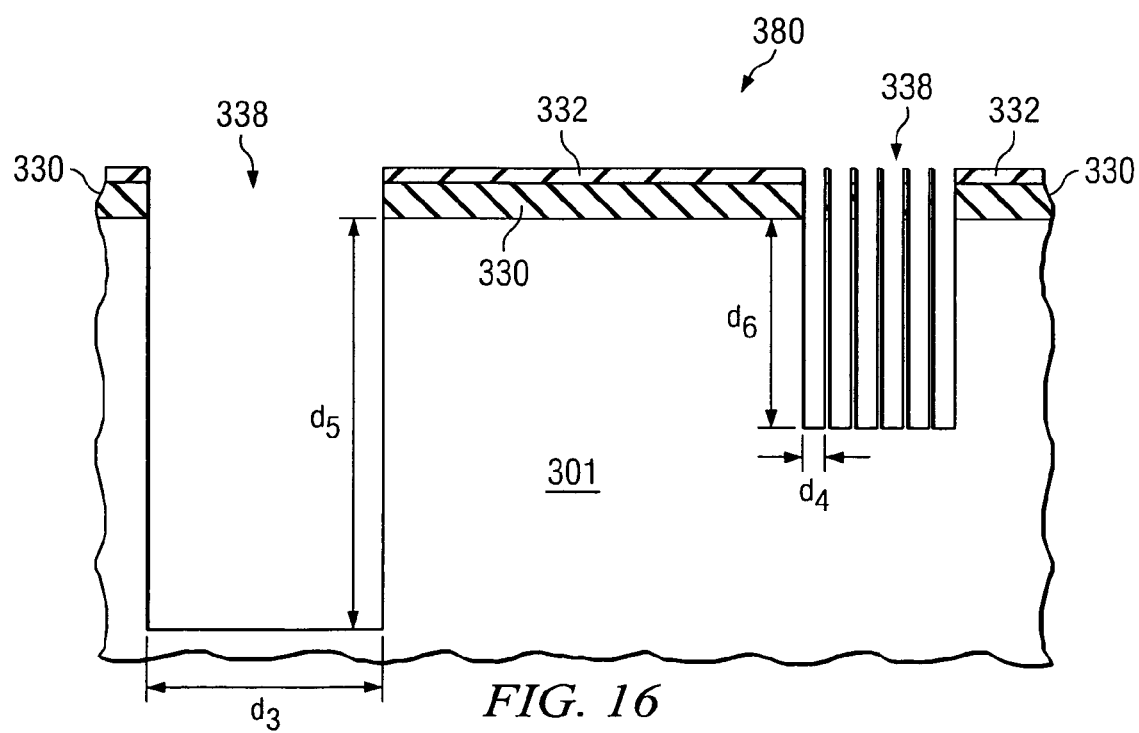

An etch process 338 is used to form trenches in the workpiece 301, as shown in FIG. 16. The etch process 338 preferably comprises a reactive ion etch (RIE), although other etch processes may also be used. The etch process preferably comprises an etch process wherein wide patterns will etch faster than narrower patterns, for example, in accordance with a preferred embodiment of the present invention. If the etch process 338 comprises a RIE process, for example, RIE lag results in the formation of shallower trenches having a depth $d_6$ being formed in the narrow patterns and deeper trenches having a depth $d_5$ within the workpiece 301, as shown. The depth $d_6$ preferably comprises about 10 µm or less, and may comprise about 4 to 8 µm, for example. The depth $d_5$ preferably comprises about 20 µm, or about 5 to 25 µm, for example. Alternatively, the trench depths $d_5$ and $d_6$ may comprise other dimensions.

Figure 17:
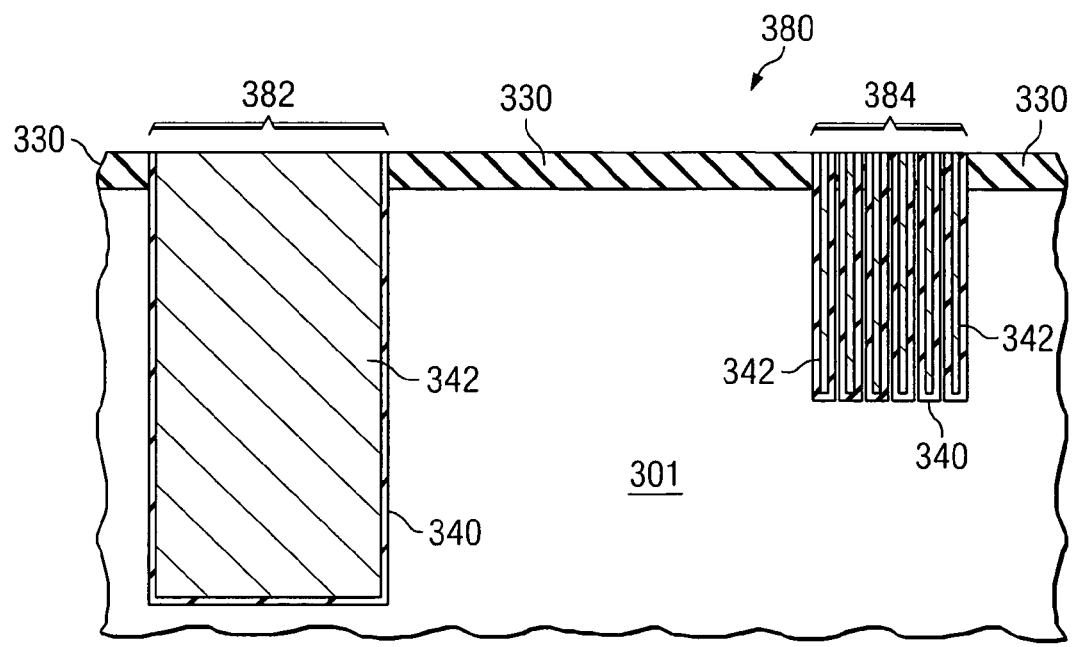

The trenches of patterns 382 and 384 may then be filled with a liner 340 and a conductive material 342, as shown in FIG. 17. The liner 340 may comprise $SiO_2$ and the conductive material 342 preferably comprises polysilicon or other semi-conductive materials, in a preferred embodiment. For example, if the pattern 384 comprises a pattern for a plurality of capacitors, then preferably the conductive material 342 comprises polysilicon.

The material 342 used to fill the wider deep via shown on the left side of FIG. 17 may comprise polysilicon, a metal, or both, for example. The wider deep via may be filled in partially or completely with the material 342 that the shallower trenches on the right side of the figure is filled with, for example. The wider deep via may also be temporarily filled with the shallower via material, e.g., the material 342 within the wider deep via may comprise a sacrificial plug material that is later removed and replaced with a lower resistivity material, such as a metal.

Figure 18:
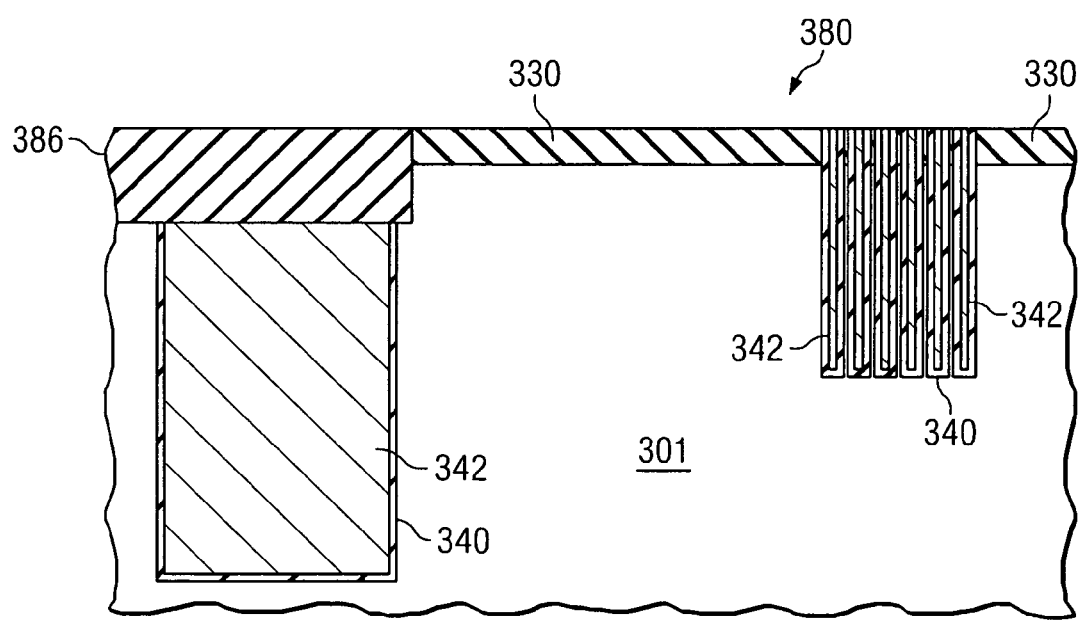
Figure 19:
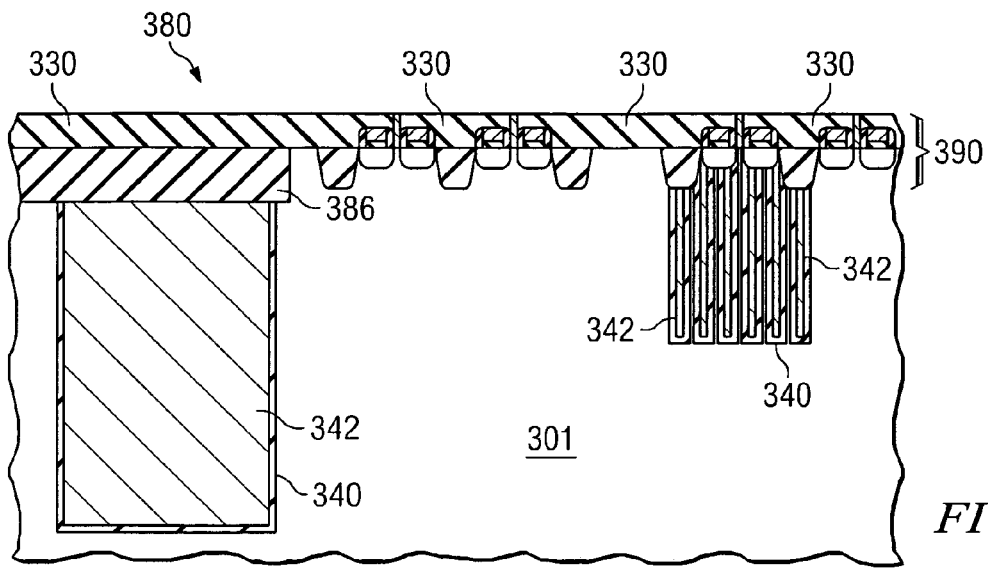
Figure 20:
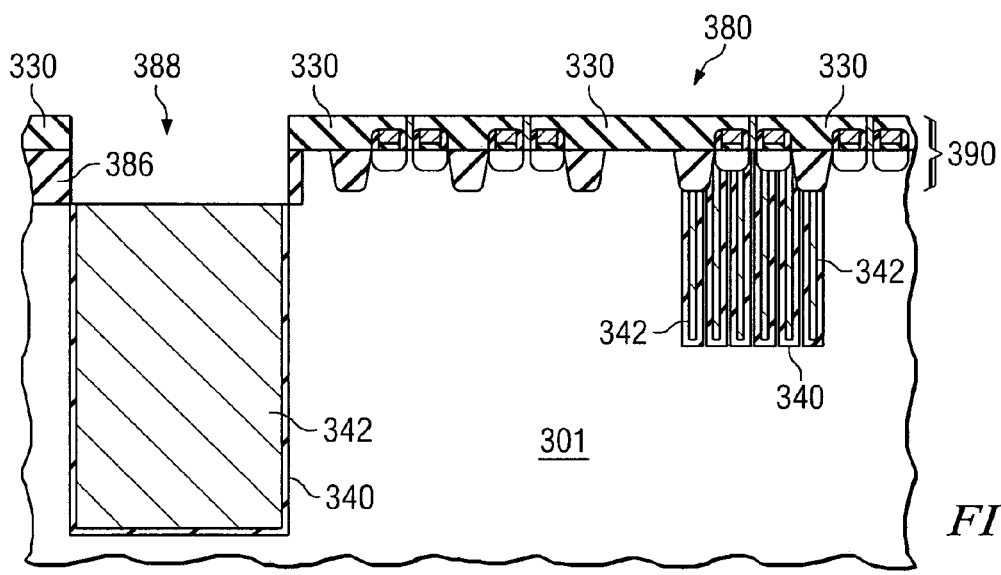

In one embodiment, the deep via on the left side of the figure may be protected during transistor processing, e.g., during the lithography process, etch, fill, and planarization processing steps, as shown in FIG. 18. For example, as shown in FIG. 18, a top portion of the deep via trench may be masked with an insulating material 386 such as $SiO_2$ or SiN, or other materials, which may be removed later and filled with a conductive material, such as a metal, in a BEOL process. For example, the insulating material 386 may be left remaining over the deep via while active areas (e.g., transistors) are formed in a FEOL process (e.g., the processing of material layers 390). For example, trenches forming isolation regions 222 and CMOS devices 224 are formed during the FEOL process. The insulating material 330 may be opened up over the deep via, as shown in FIG. 19 and the top portion 388 of the deep via, shown in FIG. 20. may then be filled with a conductive material, e.g., as part of a BEOL process, for example (not shown). The top portion of the deep via trench may be filled with a metal during a BEOL process to form the first layer of the interconnect region (e.g., such as region 210a/211a/212a shown in FIG. 9.

In some embodiments, the deep via trenches on the left side may be filled with a different material than the shallower trenches on the right side of the drawing, not shown in the drawings. For example, the deep via trenches (e.g., pattern 382 in FIG. 17) may be filled with a high temperature compatible conductive material, such as polysilicon, Ru, TiN, or Cu, and the shallower trenches (pattern 384) may be filled with highly doped polysilicon. One side of the workpiece 301 may be covered with a mask while the other side is filled and/or implanted with dopants, for example, so that the conductive material 342 is different in the deep vias and the shallower trenches. If the pattern 384 comprises isolation trenches, the shallower trenches may be filled with an insulating material, for example, wherein the deep via trenches of pattern 382 are filled with a conductive material.

After the trenches are formed and filled, and after active areas are formed in a FEOL process, interconnect regions are formed (not shown in FIGS. 15 through 20), as described with reference to FIGS. 5 through 14. Two or more ICs 380 are bonded together and vertically integrated using the novel deep vias 340/342 described herein.

Figure 21:
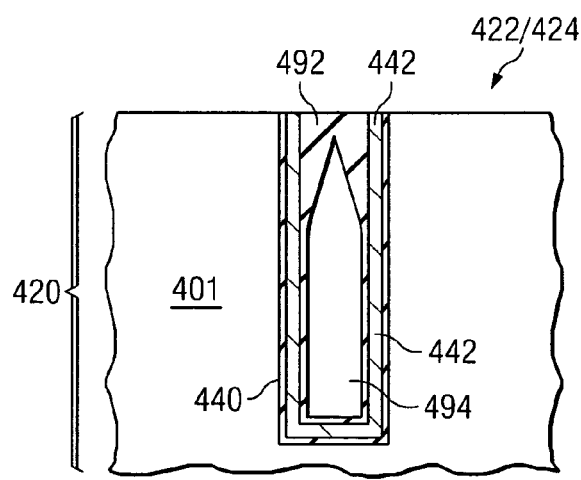
FIG. 21 shows an embodiment of the present invention, wherein a passivating capping layer is formed over the conductive material of the deep vias formed within the top portion of the workpiece, and wherein voids may form in the deep via trenches.

In some embodiments, shown in FIG. 21, the fill process used to form the conductive material 442 may result in the formation of a non-conformal fill and/or a non-bottom-up fill, which may lead to the formation of voids 494 within the trenches for the deep vias. Like numerals are used for the elements in FIG. 21 as were used to describe the previous figures, and again, to avoid repetition, each reference number shown in FIG. 21 is not described again in detail herein.

In the embodiments shown in FIG. 21, the filling of the conductive material 442 in the trenches may tend to pinch off the conductive material 442 at the top of the trenches before the trenches are completely filled, for example. In this case, preferably a capping layer 492 comprising an insulator is formed over the conductive material 442, as shown in FIG. 21. The thickness of the conductive material 442 and the capping layer 492 may depend on the width of the trenches, for example. The conductive material 442 may comprise a thickness of greater than about 500 nm to several µm, for example. The capping layer 492 preferably comprises an insulating material, such as SiC, SiCN, or SiN, as examples, although other passivating materials may also be used. The capping layer 492 preferably comprises a thickness of about 30 nm or greater, and more preferably comprises a thickness of about 100 nm or greater, for example. The capping layer 492 passivates the conductive material 442.

The capping layer 492 may be deposited using a spin-on process to completely fill the area within the trenches for the deep vias above the conductive material 442, in one embodiment. However, other deposition processes may be used that are conformal and may result in the pinching off of the capping layer 492 at the top of the trenches, as shown in FIG. 21, forming a void 494 within the capping layer 492. Excess portions of the capping layer and the conductive material 442 are then removed using a CMP process, etch process, or combinations thereof, leaving the structure shown in FIG. 21.

The voids 494 that may optionally be formed within the capped conductive material 442 do not present a problem and may be left remaining in the structure if properly processed (for example, if the conductive material 442 is covered with the capping layer 492), because the conductive material 442 still provides a path for electrical conduction from one end of each deep via 440/442 to the other end, for example. A capping layer 492 or a capping layer 492 with voids 494 formed therein may be formed in the trenches for the deep vias 240/242 and 340/342 in the embodiments of the present invention shown in FIGS. 5 through 14, and also in the embodiments of the present invention shown in FIGS. 15 through 20, for example.

Advantages of embodiments of the invention include providing novel integrated circuit structures and methods of fabrication thereof, wherein deep vias 240/242, 340/342, and 440/442 for vertical connection to other ICs are formed before two ICs are vertically coupled together. Fewer material layers are required to be etched, because the deep vias 240/242, 340/342, and 440/442 are formed earlier in the manufacturing process of the integrated circuit, which results in an improved process window.

When the workpiece 201/301 is thinned, endpoint detection may be used to determine when the end of the deep via 240/242, 340/342, and 440/442 is reached and thus exposed. Signal routing is made more flexible by the use of embodiments of the present invention, and less interconnect "real estate" is used on an integrated circuit.

Because the deep vias 240/242, 340/342, and 440/442 are formed early in the manufacturing process, e.g., before the BEOL, it is not necessary to reserve space in the BEOL circuitry, e.g., in the interconnect region, for the placement of the deep vias 240/242, 340/342, and 440/442. In the prior art, if deep vias will extend through an interconnect region, space must be reserved for the deep vias within the interconnect region pattern, because some metals such as Cu cannot be etched, for example. This is a problem for several reasons: the deep via regions cannot be used for interconnect, and dummy patterns cannot be used in the reserved deep via regions, which are often used in the fabrication process to reduce dishing during CMP processes, which can occur when damascene processes are used to form conductive lines. Because the deep vias of embodiments of the present invention do not extend through the interconnect regions 210a/211a/212a and 210b/211b/212b, a higher interconnect integration density may be achieved, and dummy patterns may be formed (e.g., in the material layers for conductive lines 210a and 210b and vias 211a and 211b within the insulating material layers 212a and 212b) that improve the CMP process and avoid dishing of the conductive features 210a, 210b, 211a, and 211b.

The novel deep vias 240/242, 340/342, and 440/442 formed early in the manufacturing process at the single die level or at the wafer level allow the use of an insulating liner 240, 340, and 440 for the deep vias 240/242, 340/342, and 440/442 that may be formed using a high temperature thermal process, e.g., at temperatures of about 400 degrees or greater, and more preferably at temperatures of about 700 degrees or more, in some embodiments, resulting in the formation of liners 240, 340, and 440 having improved insulating properties and improved step coverage, for example. The interface characteristics of the liners 240, 340, and 440 may comprise a high quality comparable to the interface characteristics of gate oxides of transistors, for example.

Furthermore, the workpiece 201, 301, and 401 may be thinned to a thickness of less than about 100 µm, decreasing the vertical size of the 3D-IC. Alternatively, the workpiece 201, 301, and 401 may be thinned to a thickness of greater than or equal to 100 µm, which may be an advantage in some applications.

Additionally, a dedicated interconnect layer for routing connections between two vertically stacked ICs is not required by embodiments of the present invention. Rather, the deep vias 240/242, 340/342, and 440/442 provide the vertical interconnection for the 3D-ICs 260 and 270.

In the embodiments shown in FIGS. 15 through 20, only one deep trench etch process is required to form the deep trenches in pattern 384 in active areas of the IC 380 and the deep trenches for the deep vias in pattern 382. This provides a cost savings, because deep trench formation tends to have a high cost of ownership (COO); e.g., the process is time-consuming and costly. By simultaneously forming trenches for the active areas and the deep vias, a lithography and etch step is eliminated, for example.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of fabricating a three dimensional (3D) integrated circuit (IC), the method comprising:
    forming a plurality of vias within a first workpiece;
    forming isolation trenches in the first workpiece;
    forming a plurality of trenches within the first workpiece;
    after forming the pluralities of vias and trenches, forming trench capacitors by filling the plurality of trenches with a first material stack within the first workpiece, the first material stack also filling the plurality of vias;
    after forming the trench capacitors, masking the plurality of vias within the first workpiece;
    after masking the plurality of vias, forming first active areas disposed between the isolation trenches in the first workpiece, the first active areas comprising CMOS devices;
    after forming the first active areas, opening the plurality of vias within the first workpiece;
    after opening the plurality of vias, filling the plurality of vias with a second material stack;

after filling the plurality of vias with the second material stack, forming a first interconnect region over the first active areas and the plurality of vias and the trench capacitors;

forming second active areas in a second workpiece;

after forming the second active areas, forming a second interconnect region over the second active areas; and after forming the second interconnect region, vertically coupling the second workpiece to the first workpiece by direct bonding, wherein the plurality of vias provides vertical electrical connections for the 3D-IC.

2. The method according to claim 1, wherein filling the plurality of trenches with the first material stack comprises forming a liner over the trenches followed by depositing a conductive material over the liner.

3. The method according to claim 1, wherein vertically coupling the second workpiece to the first workpiece comprises:

bonding a carrier workpiece to a first top surface of the first interconnect region of the first workpiece;

thinning the first workpiece, removing a bottom portion of the first workpiece and exposing an end of the plurality of vias, the thinned portion of the first workpiece and the end of the plurality of vias comprising a bottom surface, wherein vertically coupling the second workpiece to the first workpiece comprises coupling a second top surface of the second interconnect region to the bottom surface of the first workpiece; and removing the carrier workpiece from the first top surface of the first interconnect region of the first workpiece.

4. The method according to claim 1, wherein forming the plurality of vias and the plurality of trenches comprises:

depositing a layer of photoresist over the first workpiece;

patterning the layer of photoresist, wherein a first width of the pattern of the layer of photoresist in a first region is greater than a second width of the pattern of the layer of photoresist in a second region; and etching the plurality of vias in the first region simultaneously while etching the plurality of trenches in the second region, wherein etching the plurality of vias in the first region comprises forming a deeper trench than etching the plurality of trenches in the second region.

5. The method according to claim 2, wherein forming the liner comprises forming $SiO_2$, $Si_xN_y$, SiON, Ta, TaN, TiN, Cu, Ru, combinations or multiple layers thereof, and wherein depositing the conductive material comprises depositing Cu, W, Ru, TiN, silicon, doped silicon, or polysilicon.

6. The method according to claim 2, wherein forming the liner comprises using an oxidation process, a nitridation process, or a deposition process.

7. The method according to claim 6, wherein forming the liner comprises using a process comprising a temperature greater than about 400 degrees C.

8. A semiconductor device, comprising:

a first integrated circuit, the first integrated circuit comprising a workpiece, at least one active area disposed within or over the workpiece, and an interconnect region disposed over the at least one active area, wherein the at least one active area comprises trench capacitors and CMOS devices, and wherein the at least one active area is disposed between a first isolation trench and a second isolation trench;

a second integrated circuit coupled vertically to the first integrated circuit, wherein the vertical coupling is achieved by direct bonding without using adhesives; and at least one via extending completely though the workpiece to electrically couple a portion of the first integrated circuit to the second integrated circuit, or to couple a portion of the first integrated circuit to an external connection or bond pad of the first integrated circuit, wherein the at least one via extends through the workpiece and the at least one active area, but not through the interconnect region of the workpiece, and wherein the at least one via is disposed between a third isolation trench and a fourth isolation trench.

9. The semiconductor device according to claim 8, wherein the at least one via includes a liner and a conductive fill material disposed over the liner.

10. The semiconductor device according to claim 9, wherein the liner comprises a conductor, an insulator, or a combination thereof.

11. The semiconductor device according to claim 8, wherein the at least one via comprises a trench comprising sidewalls formed within the workpiece, a liner disposed over the sidewalls of the trench, a conductive material disposed over the liner, and a capping layer disposed over the conductive material.

12. The semiconductor device according to claim 11, wherein the at least one via further comprises a void in the capping layer.

13. The semiconductor device according to claim 8, wherein the interconnect region of the first integrated circuit comprises a first interconnect region, wherein the second integrated circuit comprises a second interconnect region, and wherein the second interconnect region of the second integrated circuit is coupled to the first interconnect region of the first integrated circuit.

14. The semiconductor device according to claim 8, wherein the interconnect region of the first integrated circuit comprises a first interconnect region, wherein the second integrated circuit comprises a second interconnect region, and wherein the at least one via couples a portion of the second interconnect region to a portion of the first interconnect region.

15. The semiconductor device according to claim 8, wherein the at least one via does not extend through the second integrated circuit.

16. The semiconductor device according to claim 15, wherein the at least one via comprises at least one first via, further comprising at least one second via extending through a portion of the second integrated circuit, but not through the first integrated circuit.

17. The method of claim 1, wherein forming the first interconnect region comprises forming at least three metal lines over the first workpiece.

18. The method of claim 1, wherein forming the second interconnect region comprises forming at least three metal lines over the second workpiece.

19. The method according to claim 2, wherein depositing the conductive material over the liner is part of a first metal level formation.

20. The method according to claim 1, wherein filling the plurality of vias with the second material stack comprises forming a liner over the vias followed by depositing a conductive material over the liner.

21. The method of claim 1, wherein forming the plurality of vias comprises forming vias of various widths ranging from about 0.5 um to about 3 um.

22. The method of claim 1, wherein forming the plurality of vias comprises forming vias of depths ranging from about 5 um to about 25 um.

23. The method of claim 1, wherein forming the plurality of trenches comprises forming trenches of widths less than about 400 um.

24. The method of claim 1, wherein forming the plurality of trenches comprises forming trenches of various depths ranging from about 4 um to about 8 um deep.

25. A method of fabricating a three dimensional (3D) integrated circuit (IC), the method comprising:
    forming a plurality of vias of a first width extending to a first depth within a first workpiece;
    forming isolation trenches within the first workpiece;
    forming a plurality of trenches of a second width extending to a second depth within the first workpiece, wherein the first width is larger than the second width, and wherein the first depth is deeper than the second depth;
    forming trench capacitors by filling the plurality of trenches with a first material stack within the first workpiece;
    filling the plurality of vias with a second material stack within the first workpiece, wherein the first and second material stacks comprise different materials;
    after filling the plurality of trenches and the plurality of vias, forming CMOS devices disposed between the isolation trenches in the first workpiece, the CMOS devices comprising gates disposed above the first workpiece;
    forming a first interconnect region over the CMOS devices and the plurality of vias and the trench capacitors;
    forming active areas in a second workpiece, the active areas in the second workpiece comprising CMOS devices and trench capacitors;
    forming a second interconnect region over the active areas; and
    vertically coupling the second workpiece to the first workpiece, wherein the plurality of vias provides vertical electrical connections for the 3D-IC.

26. The method according to claim 25, wherein forming the trench capacitors by filling the plurality of trenches with the first material stack comprises forming an insulating liner over the trenches followed by depositing a polysilicon over the liner.

27. The method according to claim 25, wherein filling the plurality of vias with the second material stack comprises forming an insulating liner over the vias followed by depositing a conductive metal over the liner.

28. A three dimensional (3D) integrated circuit, comprising:
    a plurality of first isolation regions forming at least one first active region disposed in a first semiconductor body;
    a plurality of trench capacitors disposed in the first active region of the first semiconductor body, wherein the plurality of trench capacitors comprises a first material stack;
    a plurality of conducting vias electrically contacting the first active region disposed within the first semiconductor body;
    a first interconnect region disposed over the first active region, wherein the plurality of conducting vias, the plurality of first isolation regions, and the plurality of trench capacitors form a first integrated circuit, wherein the plurality of conducting vias comprises a second material stack, wherein the first material stack is different from the second material stack;
    a plurality of second isolation regions forming at least one second active region disposed in a second semiconductor body; and
    a second interconnect region disposed over the second active region and the second isolation region thereby forming a second integrated circuit, wherein the first and second integrated circuits directly bond to form the 3D integrated circuit, wherein the conducting vias couple a portion of the first integrated circuit to an external connection or bond pad of the first integrated circuit, wherein the conducting vias extend through the first semiconductor body, but not through the first interconnect region, and wherein the external connection or bond pad is located directly on the semiconductor body.

29. The 3D integrated circuit of claim 28, wherein the plurality of vias comprises vias of widths ranging from about 0.5 um to about 3 um.

30. The 3D integrated circuit of claim 28, wherein the plurality of vias comprises vias of depths ranging from about 5 um to about 25 um.

31. The 3D integrated circuit of claim 28, wherein the plurality of trench capacitors comprises trenches of widths less than about 400 um.

32. The 3D integrated circuit of claim 28, wherein the plurality of trench capacitors comprises trenches of depths ranging from about 4 nm to about 8 um.

33. The 3D integrated circuit of claim 28, wherein the conducting vias extend completely through the first semiconductor body and electrically couple a portion of the first integrated circuit to the second integrated circuit.

34. The method of claim 1, wherein the second material stack. is not deposited into the plurality of trenches.

35. The method of claim 1, wherein filling the plurality of vias with a second material stack comprises depositing the second material stack into the plurality of vias partially filled with the first material stack.

36. The method of claim 35, wherein at least a part of the second material stack is filled during a BEOL process to form a first layer of the first interconnect region.

37. The method of claim 25, wherein forming the CMOS devices disposed between the isolation trenches comprises:
    masking the plurality of vias; and
    forming the isolation trenches and the active regions, the active regions being electrically isolated by the isolation trenches, the active areas comprising the CMOS devices.

38. The method of claim 37, wherein forming the first interconnect region over the CMOS devices and the plurality of vias and the trench capacitors comprises filling a top portion of the plurality of vias with a conductive material.

39. A three dimensional (3D) integrated circuit, comprising:
    a first active region disposed in a first semiconductor body, the first active region surrounded by first isolation trenches;
    deep trench capacitors of a first width disposed in the first active region of the first semiconductor body, the deep trench capacitors comprising a first material stack;
    conducting vias of a second width disposed within the first semiconductor body, the conducting vias electrically contacting the first active region, the first and the second widths being different, and the conducting vias comprising a second material stack, wherein the first material stack is different from the second material stack;
    a first interconnect region disposed over the first active region;
    a second active region disposed in a second semiconductor body, the second active region surrounded by second isolation trenches; and
    a second interconnect region disposed over the second active region, wherein the first semiconductor body is disposed above the second semiconductor body, and wherein an external connection or bond pad is located directly on the semiconductor body and connected to at least one conducting via.

40. The 3D integrated circuit of claim 39, wherein an isolation trench of the first isolation trenches is disposed above a portion of a capacitor of the deep trench capacitors.

41. The 3D integrated circuit of claim 39, wherein a bottom surface of the first semiconductor body is disposed on a top surface of the second interconnect region.

42. The 3D integrated circuit of claim 39, wherein a top surface of the first interconnect region is disposed on a top surface of the second interconnect region.

43. The 3D integrated circuit of claim 28, wherein the first material stack comprises an insulating liner with polysilicon as a fill material, and wherein the second material stack comprises an insulating liner with conductive metal fill.

44. The 3D integrated circuit of claim 39, wherein the first material stack comprises an insulating liner with a polysilicon fill material, and wherein the second material stack comprises an insulating liner with a conductive metal fill.

45. The 3D integrated circuit of claim 39, wherein the conducting vias extend completely through the first semiconductor body but not through the first interconnect region.

* * * * *

UNITED STATES PATENT AND TRADEMARK OFFICE
CERTIFICATE OF CORRECTION

PATENT NO. : 7,626,257 B2 Page 1 of 1
APPLICATION NO. : 11/334704
DATED : December 1, 2009
INVENTOR(S) : Knorr It is certified that error appears in the above-identified patent and that said Letters Patent is hereby corrected as shown below:

In Col. 16, line 67, delete "400 um" and insert --400 nm--.
In Col. 18, line 15, delete "400 um" and insert --400 nm--.
In Col. 18, line 18, delete "4 nm" and insert --4 um--.

Signed and Sealed this

Twenty-third Day of March, 2010

David J. Kappos
*Director of the United States Patent and Trademark Office*